(12) United States Patent
Moroguchi et al.

(10) Patent No.: US 11,802,333 B2
(45) Date of Patent: Oct. 31, 2023

(54) CUTTING TOOL

(71) Applicant: Sumitomo Electric Hardmetal Corp., Itami (JP)

(72) Inventors: Hironari Moroguchi, Itami (JP); Yuki Tsutsumiuchi, Itami (JP); Satoru Kukino, Itami (JP)

(73) Assignee: SUMITOMO ELECTRIC HARDMETAL CORP., Itami (JP)

(*) Notice: Subject to any disclaimer, the term of this patent is extended or adjusted under 35 U.S.C. 154(b) by 0 days.

(21) Appl. No.: 18/010,235

(22) PCT Filed: Jun. 30, 2021

(86) PCT No.: PCT/JP2021/024829
§ 371 (c)(1),
(2) Date: Dec. 14, 2022

(87) PCT Pub. No.: WO2023/276067
PCT Pub. Date: Jan. 5, 2023

(65) Prior Publication Data
US 2023/0193451 A1    Jun. 22, 2023

(51) Int. Cl.
*C23C 14/06*    (2006.01)
*C23C 14/32*    (2006.01)
(Continued)

(52) U.S. Cl.
CPC ........ *C23C 14/0641* (2013.01); *B23B 27/148* (2013.01); *C23C 14/024* (2013.01); *C23C 14/325* (2013.01); *B23B 2228/105* (2013.01)

(58) Field of Classification Search
CPC . C23C 14/0641; C23C 14/024; C23C 14/325; B23B 27/148; B23B 2228/105
See application file for complete search history.

(56) References Cited

U.S. PATENT DOCUMENTS 5,853,873 A    12/1998   Kukino et al.
7,083,868 B2*   8/2006   Horling ................. C23C 30/005
                                                          51/307

(Continued)

FOREIGN PATENT DOCUMENTS

JP    8-119774 A    5/1996
JP   2004-074378 A   3/2004
(Continued)

OTHER PUBLICATIONS

Decision to Grant received for Japanese Patent Application No. 2022-520287, dated Jul. 12, 2022, 5 pages including English translation.

*Primary Examiner* — Kevin R Kruer
(74) *Attorney, Agent, or Firm* — XSENSUS LLP

(57) ABSTRACT

A cutting tool comprising a substrate and a coating film disposed on the substrate, wherein the coating film comprises a first layer; the first layer has a thickness of 0.2 μm or more and 9 μm or less; the first layer is composed of $Ti_{(1-x-y)}Al_xM_yN$, wherein M is at least one element such as zirconium; in the first layer, x and y change along the thickness direction of the first layer; a maximum value of x, $x_{max}$, is 0.20 or more and 0.70 or less; a minimum value of x, $x_{min}$, is 0 or more and 0.6 or less; $x_{max}$ and $x_{min}$ satisfy $0.01 \leq x_{max} - x_{min} \leq 0.7$; a maximum value of y, $y_{max}$, is 0.01 or more and 0.20 or less; a minimum value of y, $y_{min}$, is 0 or more and 0.19 or less; and $y_{max}$ and $y_{min}$ satisfy $0.01 \leq y_{max} - y_{min} \leq 0.2$.

16 Claims, 6 Drawing Sheets

(51) Int. Cl.
 *B23B 27/14* (2006.01)
 *C23C 14/02* (2006.01)

(56) References Cited

U.S. PATENT DOCUMENTS

| | | | | |
|---|---|---|---|---|
| 9,711,367 | B1* | 7/2017 | Chien | H01L 21/308 |
| 2005/0263261 | A1* | 12/2005 | Moore | B22C 3/00 |
| | | | | 164/312 |
| 2007/0104551 | A1* | 5/2007 | Gaiser | B23B 51/0081 |
| | | | | 408/1 R |
| 2007/0253787 | A1 | 11/2007 | Ishii | |
| 2007/0275179 | A1* | 11/2007 | Strand | H01J 37/3429 |
| | | | | 427/524 |
| 2008/0075543 | A1* | 3/2008 | Zhu | C22C 29/08 |
| | | | | 408/1 R |
| 2008/0233388 | A1* | 9/2008 | Morita | C23C 14/0664 |
| | | | | 204/192.15 |
| 2010/0233511 | A1* | 9/2010 | Endler | C23C 28/044 |
| | | | | 427/249.19 |
| 2011/0129312 | A1* | 6/2011 | Kinoshita | C22C 29/02 |
| | | | | 407/119 |
| 2011/0277891 | A1* | 11/2011 | Clemens | C22C 14/00 |
| | | | | 419/25 |
| 2015/0158094 | A1* | 6/2015 | Igarashi | C23C 16/0272 |
| | | | | 427/249.19 |
| 2015/0225840 | A1* | 8/2015 | Andersson | C23C 14/021 |
| | | | | 204/192.16 |
| 2017/0165758 | A1* | 6/2017 | Tatsuoka | B23B 27/148 |
| 2017/0252837 | A1 | 9/2017 | Ootaka et al. | |
| 2017/0275765 | A1* | 9/2017 | Stiens | C23C 16/34 |
| 2017/0321322 | A1* | 11/2017 | Sato | C23C 28/042 |
| 2018/0036806 | A1* | 2/2018 | Michiuchi | B22F 3/24 |
| 2018/0119271 | A1* | 5/2018 | Oden | C23C 14/0641 |
| 2019/0061013 | A1 | 2/2019 | Hirano et al. | |
| 2019/0161849 | A1* | 5/2019 | Rutten | C04B 41/5062 |
| 2019/0284672 | A1* | 9/2019 | Liu | C22C 1/02 |
| 2020/0002819 | A1* | 1/2020 | Stiens | C23C 30/005 |
| 2020/0230705 | A1* | 7/2020 | Sasaki | B23D 77/00 |
| 2020/0361003 | A1* | 11/2020 | Takahashi | C23C 16/56 |
| 2021/0252604 | A1* | 8/2021 | Kido | C23C 28/42 |
| 2022/0040769 | A1* | 2/2022 | Sasaki | C23C 28/04 |
| 2022/0143712 | A1* | 5/2022 | Asanuma | B23B 27/148 |
| 2022/0371099 | A1 | 11/2022 | Dobashi | |

FOREIGN PATENT DOCUMENTS

| | | |
|---|---|---|
| JP | 2004-249397 A | 9/2004 |
| JP | 2006-334739 A | 12/2006 |
| JP | 2007-105839 A | 4/2007 |
| JP | 2007-105841 A | 4/2007 |
| JP | 2007-313636 A | 12/2007 |
| JP | 2009-028861 A | 2/2009 |
| JP | 2011-224688 A | 11/2011 |
| JP | 2019-171495 A | 10/2019 |
| JP | 2020-151774 A | 9/2020 |
| WO | 2016/031921 A1 | 3/2016 |
| WO | 2017/175803 A1 | 10/2017 |
| WO | 2019/065677 A1 | 4/2019 |
| WO | 2021/085253 A1 | 5/2021 |

* cited by examiner

CUTTING TOOL

CROSS-REFERENCE TO RELATED APPLICATION

The present application is based on PCT filing PCT/JP2021/024829, filed Jun. 30, 2021, the entire contents of which are incorporated herein by reference.

TECHNICAL FIELD

The present disclosure relates to a cutting tool.

BACKGROUND ART

In order to extend the service life of cutting tools, various studies have been made. In Japanese Patent Laying-Open No. 8-119774 (Patent Literature 1), a high-hardness composite material having a substrate made of cBN sintered material for tools is disclosed. The high-hardness composite material has a hard heat-resistant coating film having a composition represented by TiAlN. Further, in WO 2021/085253 (Patent Literature 2), a surface-coated cutting tool having a tool base made of polycrystalline cubic boron nitride sintered material and a hard coating layer on the surface of the tool base is disclosed. The hard coating layer has a lower layer (AlTiN layer) directly on the tool base, and an upper layer (AlTiBN layer) on the lower layer, and the upper layer has a compositionally modulated structure in which the boron concentration repeatedly changes along the layer thickness direction.

CITATION LIST

Patent Literature

PTL 1: Japanese Patent Laying-Open No. 8-119774
PTL 2: WO 2021/085253

SUMMARY OF INVENTION

A cutting tool of the present disclosure relates to a cutting tool comprising a substrate and a coating film disposed on the substrate, wherein
the coating film comprises a first layer;
the first layer has a thickness of 0.2 μM or more and 9 μm or less;
the first layer is composed of $Ti_{(1-x-y)}Al_xM_yN$,
wherein M is at least one element selected from the group consisting of zirconium, hafnium, a group V element in the periodic table, a group VI element, silicon and boron:
in the first layer, x and y change along a thickness direction of the first layer;
a maximum value of x, $x_{max}$, is 0.20 or more and 0.70 or less,
a minimum value of x, $x_{min}$, is 0 or more and 0.6 or less;
$x_{max}$ and $x_{min}$ satisfy $0.01 \leq x_{max} - x_{min} \leq 0.7$;
a maximum value of y, $y_{max}$, is 0.01 or more and 0.20 or less;
a minimum value of y, $y_{min}$, is 0 or more and 0.19 or less; and
$y_{max}$ and $y_{min}$ satisfy $0.01 \leq y_{max} - y_{min} \leq 0.2$.

DETAILED DESCRIPTION

Figure 1:
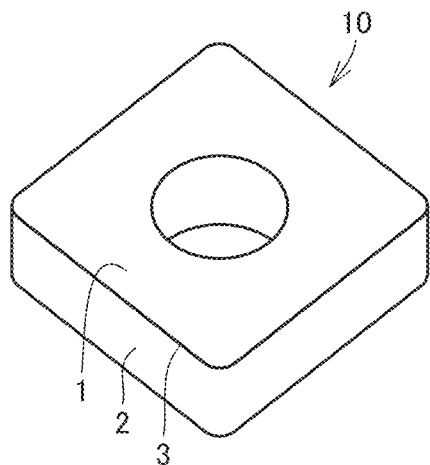
FIG. 1 is a perspective view showing an aspect of a cutting tool of the present disclosure.
Figure 2:
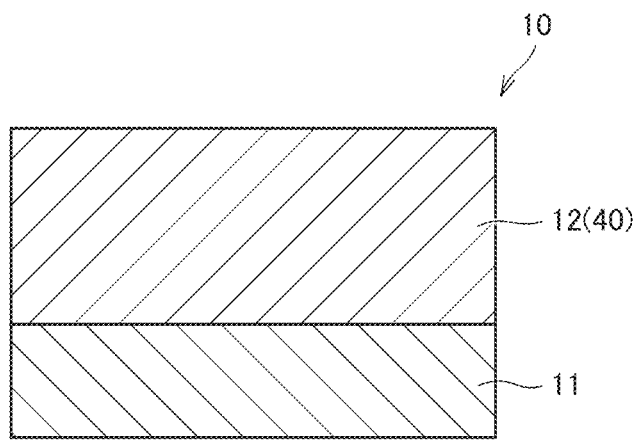
FIG. 2 is a schematic cross-sectional view showing an aspect of a cutting tool of the present disclosure.
Figure 3:
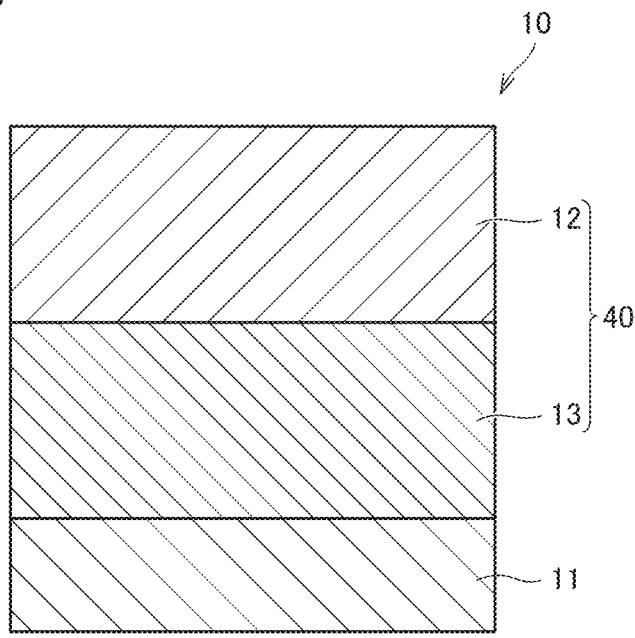
FIG. 3 is a schematic cross-sectional view showing another aspect of a cutting tool of the present disclosure.

Problem to be Solved by the Present Disclosure

In recent years, needs of high-efficiency processing has been enhanced. Along with the needs, a cutting tool having a long tool life has been required even in high-efficiency processing.

Accordingly, an object of the present disclosure is to provide a cutting tool having a long tool life even in high-efficiency processing

Advantageous Effect of the Present Disclosure

According to the present disclosure, a cutting tool having a long tool life may be provided even in high-efficiency processing.

DESCRIPTION OF EMBODIMENTS

First, embodiments of the present disclosure are listed and explained.

(1) A cutting tool comprises a substrate and a coating film disposed on the substrate, wherein
the coating film comprises a first layer;
the first layer has a thickness of 0.2 μm or more and 9 μm or less;
the first layer is composed of $Ti_{(1-x-y)}Al_xM_yN$,
wherein M is at least one element selected from the group consisting of zirconium, hafnium, a group V element in the periodic table, a group VI element, silicon and boron;
in the first layer, x and y change along a thickness direction of the first layer;
a maximum value of x, $x_{max}$, is 0.20 or more and 0.70 or less;
a minimum value of x, $x_{min}$, is 0 or more and 0.6 or less;
$x_{max}$ and $x_{min}$ satisfy $0.01 \leq x_{max} - x_{min} \leq 0.7$;
a maximum value of y, $y_{max}$, is 0.01 or more and 0.20 or less;
a minimum value of y, $y_{min}$, is 0 or more and 0.19 or less; and
$y_{max}$ and $y_{min}$ satisfy $0.01 \leq y_{max} - y_{min} \leq 0.2$.

The cutting tool of the present disclosure may have a long tool life even in high-efficiency processing.

(2) In the first layer, an average of crystallite size is preferably 5 nm or more and 90 nm or less. Thereby, the film strength of the coating film is further improved. Further, occurrence of cracks in the first layer is suppressed.

(3) The coating film further comprises a foundation layer, wherein the foundation layer is disposed directly on the substrate and directly under the first layer,
the foundation layer has a thickness of 0.05 μm or more and 1.0 μm or less,
the foundation layer comprises $Ti_aAl_{1-a}N$ or $Al_pCr_{1-p}N$;
a is 0.2 or more and 1.0 or less,
and p is preferably 0 or more and 0.8 or less. Thereby, the adhesion between the substrate and the coating film of the cutting tool is improved.

(4) The first layer has a residual stress of preferably −3.0 GPa or more and −0.1 GPa or less. Thereby, the film strength of the coating film is further improved.

(5) A roughness of a surface of the coating film, $Ra_{surf}$, is preferably 0 μm or more and 0.1 μm or less. Thereby, the peeling resistance of the coating film is improved.

(6) A skewness of a surface of the coating film, $Rsk_{surf}$, is preferably −2 or more and 2 or less Thereby, the peeling resistance of the coating film is further improved.

(7) A skewness of a surface of the substrate in contact with the coating film, $Rsk_{sub}$, is preferably −2 or more and 2 or less. Thereby, the peeling resistance of the coating film is further improved.

(8) A ratio of X-ray diffraction intensity $I_{(200)}$ of (200) plane of the first layer to a sum of $I_{(200)}$, X-ray diffraction intensity $I_{(111)}$ of (111) plane of the coating film, and X-ray diffraction intensity $I_{(220)}$ of (220) plane of the coating film, $I_{(200)}/(I_{(200)}+I_{(111)}+I_{(220)})$, is preferably 0.50 or more Thereby, the peeling resistance of the coating film is further improved.

DETAILS OF THE EMBODIMENTS OF THE PRESENT DISCLOSURE

A specific example of the cutting tool in an embodiment of the present disclosure (hereinafter also referred to as "present embodiment") is explained with reference to drawings. In the drawings of the present disclosure, the same reference sign represents the same part or a corresponding part. Dimensions such as length, width, thickness, depth, etc., are appropriately changed for clarification and simplification of drawings, not necessarily representing actual dimensions.

In the present specification, an expression in the form of "A to B" means to include the upper limit and the lower limit of a range (in other words, A or more and B or less). In the case where A has no unit added while B has a unit added, the unit of A and the unit of B are the same.

In the present specification, in the case where a compound or the like is represented by a chemical formula without particular limitation on the atomic ratio, all the conventionally known atomic ratios are included, not necessarily limited to the stoichiometric range alone. For example, a description "TiAlSiN" allows the ratio of the number of atoms constituting TiAlSiN to include all the conventionally known atomic ratios.

In the present specification, individual planes in crystallographic description are represented in ( ).

Embodiment 1: Cutting Tool

As shown in FIG. 2 to FIG. 6, a cutting tool 10 of the present embodiment comprises a substrate 11 and a coating film 40 disposed on substrate 11,
coating film 40 comprises a first layer 12;
first layer 12 has a thickness of 0.2 μm or more and 9 μm or less;
first layer 12 is composed of $Ti_{(1-x-y)}Al_xM_yN$,
wherein M is at least one element selected from the group consisting, of zirconium, hafnium, a group V element in the periodic table, a group VI element, silicon and boron;
in first layer 12, x and y change along the thickness direction of first layer 12;
a maximum value of x, $x_{max}$, is 0.20 or more and 0.70 or less;
a minimum value of x, $x_{min}$, is 0 or more and 0.6 or less;
$x_{max}$ and $x_{min}$ satisfy $0.01 \leq x_{max}-x_{min} \leq 0.7$;
a maximum value of y, $y_{max}$, is 0.01 or more and 0.20 or less;
a minimum value of y, $y_{min}$, is 0 or more and 0.19 or less; and
$y_{max}$ and $y_{min}$ satisfy $0.01 \leq y_{max}-y_{min} \leq 0.2$.

The cutting tool of the present disclosure may have a long tool life even in high-efficiency processing. The reason is presumed as follows.

In first layer 12, x and y change along the thickness direction of first layer 12, a maximum value of x, $x_{max}$, is 0.20 or more and 0.70 or less, a minimum value of x, $x_{min}$, is 0 or more and 0.6 or less, $x_{max}$ and $x_{min}$ satisfy $0.01 \leq x_{max}-x_{min} \leq 0.7$, a maximum value of y, $y_{max}$, is 0.01 or more and 0.20 or less, a minimum value of y, $y_{min}$, is 0 or more and 0.19 or less, and $y_{max}$ and $y_{min}$ satisfy $0.01 \leq y_{max}-y_{min} \leq 0.2$. As a result, grain growth in first layer 12 is suppressed, because the lattice constants of $Ti_{(1-x-y)}Al_xM_yN$ are hardly equalized. Accordingly, in first layer 12, fine texture may be formed. As a result, cutting tool 10 having coating film 40 including first layer 12 has excellent film strength, so that a long tool life may be achieved even in high-efficiency processing.

The shape and use of cutting tool 10 of the present embodiment are not particularly limited. Examples of the shape of cutting tool 10 of the present embodiment include a drill, an end mill, an indexable cutting insert for drilling, an indexable cutting insert for end milling, an indexable cutting insert for milling, an indexable cutting insert for lathe turning, a metal saw, a gear cutting tool, a reamer, a tap, and a tip for pin milling of a crankshaft.

FIG. 1 is a perspective view showing an aspect of a cutting tool 10 of the present disclosure. Cutting tool 10 in such a shape is used as an indexable cutting insert such as an indexable cutting insert for lathe turning.

Further, cutting tool 10 of the present embodiment is not limited to one having a structure in which the whole of cutting tool 10 includes a substrate 11 and a coating film 40 formed on substrate 11 as shown in FIG. 1 alone, but includes one having the structure in a part of cutting tool 10 (in particular, cutting edge (cutting blade), etc.) only. For example, one in which the cutting edge portion alone of the base (support) made of cemented carbide or the like has the structure is also included in the cutting tool of the present embodiment. In that case, literally, the cutting edge portion is presumed to be the cutting tool. In other words, even in the case where the structure occupies only a part of the cutting tool, the structure is referred to as the cutting tool.

<<Substrate>>

As the substrate of the present embodiment, a conventionally known substrate of this type may be used without any particular limitation. Examples thereof include a cemented carbide (for example, a tungsten carbide (WC)-based cemented carbide, a cemented carbide containing Co in addition to WC, and a cemented carbide with addition of a carbonitride of Ti, Ta, Nb, etc., in addition to WC), a cermet (containing TiC, TiN, TiCN or the like as main component), a high-speed steel, a tool steel, ceramics (titanium carbide (TiC), silicon carbide (SiC), silicon nitride (SiN), Aluminum nitride (AlN), aluminum oxide ($Al_2O_3$), sialon, and mixture thereof), a polycrystalline cubic boron nitride sintered material (cBN sintered material), a diamond sintered material, and a hard material with polycrystalline cubic boron nitride particles dispersed in a binder phase.

Among these various substrates, a polycrystalline cubic boron nitride sintered material is particularly preferably selected. The reason is that the polycrystalline cubic boron nitride sintered material exhibits particularly excellent abrasion resistance in cutting of an iron-based high-hardness material, having suitability for a substrate of cutting tools for the use.

In the case where a cemented carbide is used as substrate, the cemented carbide exhibits the effect of the present embodiment even when containing free carbon or an abnormal phase referred to as η phase in the texture. The substrate for use of the present embodiment allows the surface to be a modified surface. For example, a cemented carbide may have a de-β layer formed on the surface, and a cBN sintered material may have a surface hardened layer. Even with such modification of the surface, the effect of the present embodiment may be exhibited.

In the case where the cutting tool is an indexable cutting insert (indexable cutting insert for lathe turning, an indexable cutting insert for milling, etc.), the substrate may include one having a tip breaker or one having no tip breaker. The shape of the cutting edge may include any one of a sharp edge (a ridge at which a rake face and a flank face cross), a honed shape (rounded sharp edge), a negative land (chamfered shape), and a combined shape of a honed shape and a negative land.

(Skewness of Surface of Substrate in Contact with the Coating Film)

Figure 9:
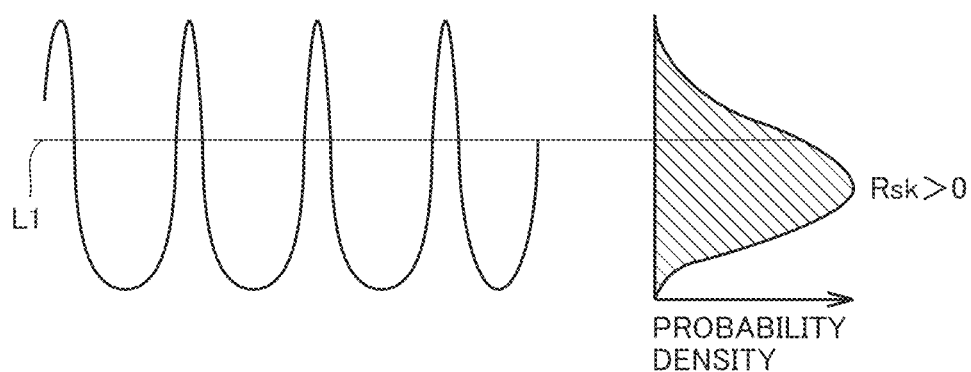
FIG. 9 is a diagram illustrating the relationship between the surface irregularity and skewness.
Figure 10:
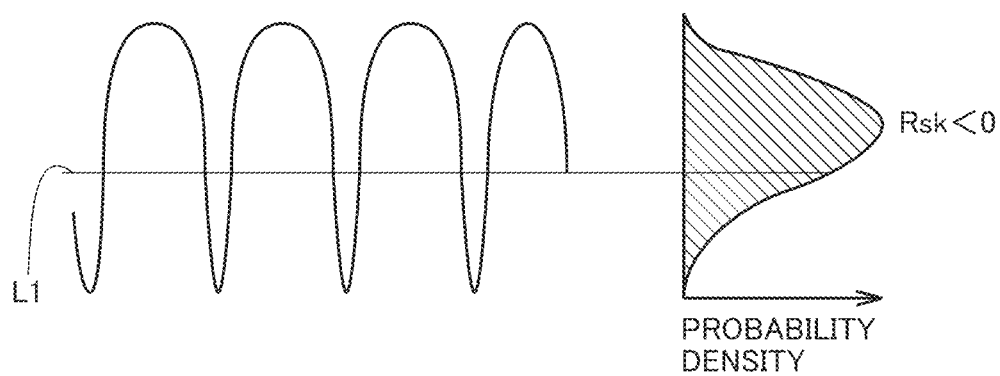
FIG. 10 is a diagram illustrating the relationship between the surface irregularity and skewness.

The skewness of a surface of the substrate in contact with the coating film, $Rsk_{sub}$, is preferably −2 or more and 2 or less. The term "skewness" means the skewness of the roughness curve specified in HS B 0601-2001, which is a parameter representing the degree of distortion of ridges and valleys of a plane. In other words, the term "skewness" is an index representing the symmetricalness of the ridges and valleys relative to an average line L1 as center as shown in FIG. 9 and FIG. 10. In the case where the plane is skewed to the upper side relative to average line L1, the "skewness" has a positive value (FIG. 9). In contrast, in the case where the plane is skewed to the lower side relative to average line L1, the "skewness" has a negative value (FIG. 10). Further, in the case where the probability density distribution curve shown in FIG. 9 or FIG. 10 follows a normal distribution, the skewness has a value of "0".

In the case where the skewness of the surface of the substrate in contact with the coating film, $Rsk_{sub}$, is −2 or more and 2 or less, the surface of the substrate in contact with the coating film has a reduced skew of distribution of the ridges and valleys. As a result, the adhesion between the substrate and the coating film may be improved. The surface of the substrate in contact with the coating film has a reduced skew of distribution of the ridges and valleys. As a result, the stress concentration caused by a load during processing is reduced, so that the peeling resistance of the coating film may be improved. The relations between the skewness $Rsk_{sub}$ and adhesion between the substrate and the coating film, and between the skewness $Rsk_{sub}$ and the peeling resistance of the coating film have been newly found by the present inventors.

The lower limit of the $Rsk_{sub}$ is more preferably −1.8 or more, still more preferably −1.6 or more, and furthermore preferably −1.4 or more. The upper limit of the $Rsk_{sub}$ is more preferably 1.8 or less, still more preferably 1.6 or less, and furthermore preferably 1.4 or less. Further, the $Rsk_{sub}$ is more preferably −1.8 or more and 1.8 or less, still more preferably −1.6 or more and 1.6 or less, and furthermore preferably −1.4 or more and 1.4 or less.

<Method for Measuring Skewness of Surface of Substrate in Contact with Coating Film, $Rsk_{sub}$>

The skewness of a surface of the substrate in contact with the coating film, $Rsk_{sub}$, may be determined, for example, by the following method. First, a cutting tool is cut along the normal direction of the flank face with the cutting edge included to expose the cross section. The cutting may be performed using a focused ion beam system, a cross section polisher, or the like. Using a scanning electron microscope (SEM), the cross section is observed with a magnifying power of 2000 to obtain a backscattered electron image. Subsequently, using an image processing software (e.g., trade name "Winroof" manufactured by Mitani Corporation), the backscattered electron image is magnified 2.5 times to obtain a field of view. Subsequently, in the field of view, any optional 50 μm-square spot including "surface of coating film" and "face in contact with the coating film of a substrate (corresponding to the interface between the substrate and the coating film)" is selected to trace the "face of the substrate in contact with the coating film" as a line for extraction. The extracted line is converted into numerical values using an image processing software (e g trade name "Winroof" manufactured by Mitani Corporation) to calculate the average of the numerical values. Here, expression "converting a line into numerical values" means that when the extracted line is placed on an x-y coordinate axis, the y-axis values of the line are outputted in the x-axis direction at 0.05 μm intervals. Subsequently, based on the average, an average line is drawn in the direction approximately parallel with the face of the substrate in contact with the coating film Subsequently, in coordinate axes with the average line as X-axis, and with the vertical direction to the X-axis as Y axis, the face roughness curve Z (x) at the surface of the coating film is obtained using the image processing software. Subsequently, Z (x) is assigned to the following formula (1) to obtain Rq Here, "1" is "50 μm"

[Expression 1]

$$Rq = \sqrt{\frac{1}{\ell} \int_0^\ell Z^2(x)dx} \quad (1)$$

Subsequently, Z(x) and Rq are assigned to the following formula (2) to obtain skewness Rsk

[Expression 2]

$$Rsk = \frac{1}{Rq^3}\left(\frac{1}{\ell}\int_0^\ell Z^3(x)dx\right) \qquad (2)$$

The above procedure is performed for five optional fields of view in the cross section to obtain the Rsk, of which average is calculated to determine the skewness $Rsk_{sub}$.

<<Coating Film>>

Coating film 40 is disposed on substrate 11 (FIG. 2 to FIG. 6). FIG. 2 to FIG. 6 are schematic cross-sectional views showing an aspect of the cutting tool of the present disclosure. "Coating film" covers at least the cutting edge of substrate 11, so that various properties such as peeling resistance, breakage resistance and abrasion resistance of a cutting tool are improved. The cutting edge described herein means a region within 500 μm from the cutting edge ridgeline along the substrate surface. It is preferable that coating film 40 cover whole the surface of substrate 11. However, the case where a part of substrate 11 is not covered with coating film 40, or the structure of coating film 40 is partly different is included within the scope of the present embodiment.

The thickness of the coating film is preferably 0.4 μm or more and 8 μm or less, more preferably 0.6 μm or more and 7 μm or less, still more preferably 0.8 μm or more and 6 μm or less, furthermore preferably 1.0 μm or more and 5 μm or less, and particularly preferably 1.2 μm or more and 4 μm or less. The thickness of the coating film means the sum total of the respective thicknesses of the layers that constitute the coating film Examples of the "layers that constitute the coating film" include the first layer, the foundation layer, and another layer that is described as a layer other than the first layer and the foundation layer in the following.

The thickness of the coating film may be determined as follows. First, a cutting tool is cut at an optional position to prepare a sample including the cross section of the coating film. For the preparation of the sample, a focused ion beam system, a cross section polisher, etc. may be used. Subsequently, the prepared cross section is observed with a scanning electron microscope, with the magnification power being adjusted to include the whole region in the thickness direction of the coating film in the observed image. Subsequently, the thickness is observed at five points, and the average thereof is determined as the thickness of the coating film. The measurement of the thickness of the first layer, the foundation layer or the other layer is performed in the same manner.

Coating film 40 includes first layer 12. In an aspect of the present embodiment, a plurality of first layers 12 may be disposed as long as the effect that the cutting tool exhibits is maintained. Thereby, even when a part of the coating film is worn, the first layer remains in the coating film, so that the cutting tool may retain excellent film strength. The expression "including the first layer" means that the coating film may include the foundation layer and another layer other than the first layer and the foundation layer described in the following, in addition to the first layer (Skewness of Surface of Coating Film)

The skewness of a surface of the coating film, $Rsk_{surf}$ is preferably −2 or more and 2 or less. Thereby, the surface of the coating film has a reduced skew of distribution of the ridges and valleys. As a result, the stress concentration caused by a load during processing is reduced, so that the peeling resistance of the coating film may be improved. The lower limit of the $Rsk_{surf}$ is more preferably −1.8 or more, still more preferably −1.6 or more, and furthermore preferably −1.4 or more. The upper limit of the $Rsk_{surf}$ is more preferably 1.8 or less, still more preferably 1.6 or less, and furthermore preferably 1.4 or less. Further, the $Rsk_{surf}$ is more preferably −1.8 or more and 1.8 or less, still more preferably −1.6 or more and 1.6 or less, and furthermore preferably −1.4 or more and 1.4 or less.

(Surface Roughness of Coating Film)

The roughness of a surface of the coating film, $Ra_{surf}$ is preferably 0 μm or more and 0.1 μm or less. Thereby, irregularities on the surface of the coating film is reduced. As a result, the stress concentration caused by a load during processing is reduced, so that the peeling resistance of the coating film may be improved. The lower limit of the $Ra_{surf}$ is preferably 0.01 μm or more, more preferably 0.02 μm or more, and still more preferably 0.03 μm or more. The upper limit of the $Ra_{surf}$ is preferably 0.09 μm or less, more preferably 0.08 μm or less, and still more preferably 0.07 μm or less. Further, the $Ra_{surf}$ is preferably 0.01 μm or more and 0.09 μm or less, more preferably 0.02 μm or more and 0.08 μm or less, and still more preferably 0.03 μm or more and 0.08 μm or less. The term "surface roughness Ra" means the arithmetic average roughness specified in JIS B 0601-2001.

The roughness of a surface of the coating film, $Ra_{surf}$ is measured by the following procedure. On the rake face in the region within a distance of 1000 μm from the cutting edge, a 400 μm-square measurement region is set. The surface roughness of the measurement region is measured with a stylus-type surface profile meter. By the same procedure, the surface roughness is measured in a measurement region at five optional spots. The average of the surface roughness at the five spots is calculated to determine the roughness of a surface of the coating film, $Ra_{surf}$. It is to be noted that the "skewness of a surface of the coating film, $Rsk_{surf}$" is also determined by the same method.

<First Layer>

The first layer preferably has a thickness of 0.2 μm or more and 9 μm or less. Thereby, the film strength of the coating film is improved. As a result, the film strength of the coating film may be improved. The lower limit of the thickness of the first layer is preferably 0.4 μm or more, more preferably 0.6 μm or more, and still more preferably 0.8 μm or more. The upper limit of the thickness of the first layer is preferably 8 μm or less, more preferably 7 μm or less, and still more preferably 6 μm or less. Further, the thickness of the first layer is preferably 0.4 μm or more and 8 μm or less, more preferably 0.6 μm or more and 7 μm or less, and still more preferably 0.8 μm or more and 6 μm or less.

The first layer is composed of $Ti_{(1-x-y)}Al_xM_yN$, wherein M is at least one element selected from the group consisting of zirconium, hafnium, a group V element in the periodic table, a group VI element, silicon and boron. Thereby, the first layer may have excellent strength.

In first layer 12, x and y change along the thickness direction of first layer 12; a maximum value of x, $x_{max}$, is 0.20 or more and 0.70 or less; a minimum value of x, $x_{min}$, is 0 or more and 0.6 or less; $x_{max}$ and $x_{min}$ satisfy $0.01 \leq x_{max} - x_{min} \leq 0.7$; a maximum value of y, $y_{max}$, is 0.01 or more and 0.20 or less; a minimum value of y, $y_{min}$, is 0 or more and 0.19 or less; and $y_{max}$ and $y_{min}$ satisfy $0.01 \leq y_{max} - y_{min} \leq 0.2$. As a result, grain growth in first layer 12 is suppressed, because the lattice constants of $Ti_{(1-x-y)}Al_xM_yN$ are hardly equalized. Accordingly, in first layer 12, fine texture may be formed. As a result, cutting tool 10 having coating film 40 including first layer 12 may have excellent film strength.

The lower limit of the $x_{max}$ is preferably 0.25 or more, more preferably 0.3 or more, and still more preferably 0.35 or more. The upper limit of the $x_{max}$ is preferably 0.65 or less, more preferably 0.6 or less, and still more preferably 0.55 or less. The $x_{max}$ is preferably 0.25 or more and 0.65 or less, more preferably 0.3 or more and 0.6 or less, and still more preferably 0.35 or more and 0.55 or less.

The lower limit of the $x_{min}$ is preferably 0.05 or more, more preferably 0.1 or more, and still more preferably 0.15 or more. The upper limit of the $x_{min}$ is preferably 0.57 or less, more preferably 0.54 or less, and still more preferably 0.50 or less. The $x_{min}$ is preferably 0.05 or more and 0.57 or less, more preferably 0.1 or more and 0.54 or less, and still more preferably 0.15 or more and 0.50 or less.

The lower limit of the $y_{max}$ is preferably 0.015 or more, more preferably 0.02 or more, and still more preferably 0.025 or more. The upper limit of the $y_{max}$ is preferably 0.18 or less, more preferably 0.16 or less, and still more preferably 0.14 or less. The $y_{max}$ is preferably 0.015 or more and 0.18 or less, more preferably 0.02 or more and 0.16 or less, and still more preferably 0.025 or more and 0.14 or less.

The lower limit of the $y_{min}$ is preferably 0.005 or more, more preferably 0.01 or more, and still more preferably 0.015 or more. The upper limit of the $y_{min}$ is preferably 0.17 or less, more preferably 0.15 or less, and still more preferably 0.13 or less. The $y_{min}$ is preferably 0.005 or more and 0.17 or less, more preferably 0.01 or more and 0.15 or less, and still more preferably 0.015 or more and 0.13 or less.

The lower limit of the $x_{max}-x_{min}$ is preferably 0.05 or more, more preferably 0.1 or more, and still more preferably 0.15 or more. The upper limit of the $x_{max}-x_{min}$ is preferably 0.6 or less, more preferably 0.5 or less, and still more preferably 0.4 or less. The $x_{max}-x_{min}$ is preferably 0.05 or more and 0.6 or less, more preferably 0.1 or more and 0.5 or less, and still more preferably 0.15 or more and 0.4 or less The lower limit of the $y_{max}-y_{min}$ is preferably 0.015 or more, more preferably 0.02 or more, and still more preferably 0.025 or more. The upper limit of the $y_{max}-y_{min}$ is preferably 0.18 or less, more preferably 0.16 or less, and still more preferably 0.15 or less. The $y_{max}-y_{min}$ is preferably 0.015 or more and 0.18 or less, more preferably 0.02 or more and 0.16 or less, and still more preferably 0.025 or more and 0.15 or less.

The $x_{max}$, $x_{min}$, $y_{max}$ and $y_{min}$ may be determined as follows. First, the type and atomic content ratio of the element represented by M in $Ti_{(1-x-y)}Al_xM_yN$ that constitutes the first layer, and the atomic content ratio of Al are measured by Auger electron spectroscopy along the thickness direction of the first layer from the flank face side of the coating film. The analysis conditions and the conditions for ion sputtering ($Ar^+$) are as follows
(Analysis Conditions)
 Energy of primary electron: 10 keV
 Electric current: about 3 nA
 Incident angle: 0 degree relative normal line of flank face of sample
 Analysis region: about 10 μm by 10 μm
(Conditions for Ion Sputtering ($Ar^+$))
 Energy: 1 keV
 Incident angle: about 0 degree relative to normal line of flank face of sample
 Sputtering rate: about 2 nm/min
The measurement is performed at five optional points. From the average of the measured values of the atomic content ratio at the five points, $x_{max}$, $x_{min}$, $y_{max}$ and $y_{min}$ are determined. Further, the type of element represented by M is identified.

In the present specification, the expression "in the first layer, x and y change along the thickness direction of the first layer" is a concept including an aspect in which "in the first layer, x and y periodically change along the thickness direction of the first layer at the same period width" and an aspect other than the aspect in which "in the first layer, x and y periodically change along the thickness direction of the first layer at the same period width".

In the case where in the first layer, x and y periodically change along the thickness direction of the first layer at the same period width, the average of the period width may be 1 nm or more and 500 nm or less. The average of the period width is determined by plotting the $x_{max}$, $x_{min}$, $y_{max}$ and $y_{min}$ in a graph with the horizontal axis representing the depth of the first layer and the vertical axis representing the concentration of x or y so as to identify the periodicity of x or y.

In the case where in the first layer, x and y periodically change along the thickness direction of the first layer at the same period width, the $x_{max}$, and the $y_{max}$ are preferably the maximum value of x and the maximum value of y of the period width, respectively. The $x_{min}$, and the $y_{min}$ are preferably the minimum value of x and the minimum value of y of the period width, respectively. Thereby, in first layer 12, a finer texture may be formed. As a result, cutting tool 10 having coating film 40 including first layer 12 may have more excellent film strength.

In the cutting tool of the present embodiment, the respective period widths include a region No 1-1 (not shown in drawing) and a region No. 1-2 (not shown in drawing) laminated along the thickness direction of the first layer. In region No. 1-1, the x may be the maximum value $x_{max}$, and the y may be the maximum value $y_{max}$, and in region No. 1-2, the x may be the minimum value $x_{min}$, and the y may be the minimum value $y_{min}$. In this case, the relation between the depth of the first layer and x or y is explained with use of FIG. 7.

Figure 7:
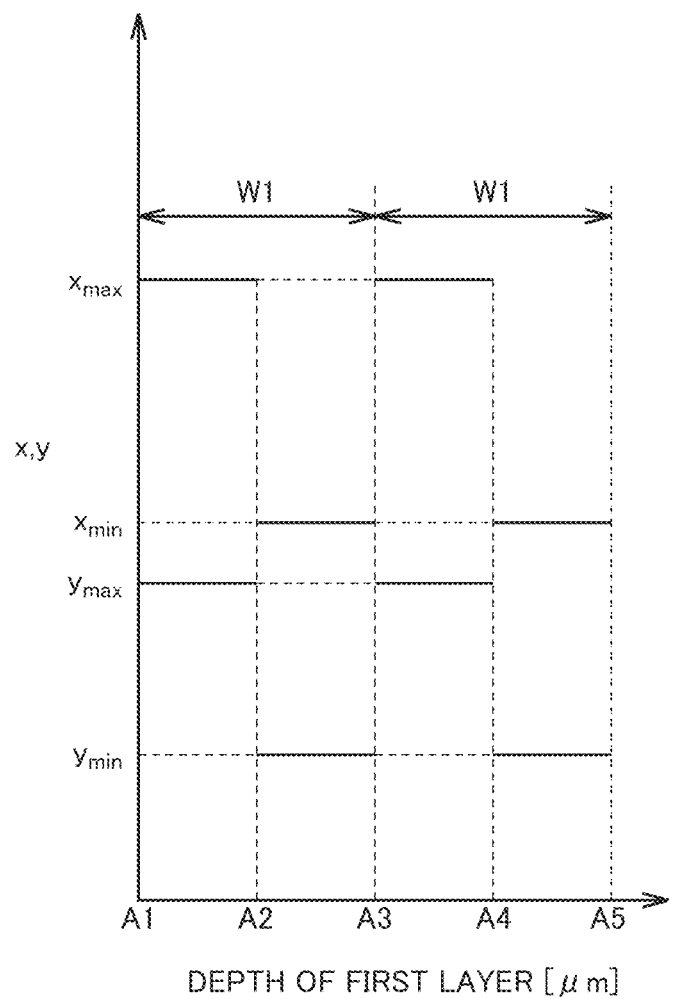
FIG. 7 is a graph showing the relationship between the depth of the first layer and x or y in an aspect of the cutting tool of the present disclosure.

In the graph of FIG. 7, the horizontal axis represents the depth of the first layer, and the vertical axis represents the concentration of x or y. The intersection point of the vertical axis and the horizontal axis is a spot nearest to the surface side of the coating film in the first layer. In other words, the intersection point represents a spot having a depth of 0 μm in the first layer. The spot having a depth of 0 μm in the first layer is represented as A1 in FIG. 7. In the region ranging from a depth of 0 μm (A1) to a depth of A2 μm, the x is the maximum value $x_{max}$ and the y is the maximum value $y_{max}$; and the region corresponds to region No. 1-1. In the region ranging from a depth of A2 μm to a depth of A3 μm, the x is the minimum value $x_{min}$ and they is the minimum value $y_{min}$; and the region corresponds to region No. 1-2. Further, in the region ranging from a depth of A3 μm to a depth of A4 μm, the x is the maximum value $x_{max}$ and the y is the maximum value $y_{max}$; and the region corresponds to region No. 1-1. In the region ranging from a depth of A4 μm to a depth of A5 μm, the x is the minimum value $x_{min}$ and the y is the minimum value $y_{min}$; and the region corresponds to region No. 1-2.

In FIG. 7, the sum total of the depth of a pair next to each other including region No. 1-1 and region No. 1-2, i.e., a distance W1 from a depth of 0 μm (A1) to a depth of A3 μm, or a distance W1 from a depth of A3 μm to a depth of A5 μm, corresponds to the period width.

In the cutting tool of the present embodiment, the respective period widths include a region No. 1-1 (not shown in drawing) and a region No. 1-2 (not shown in drawing) laminated along the thickness direction of the first layer. In region No. 1-1, the x may be the minimum value $x_{max}$, and the y may be the minimum value $y_{min}$, and in region No. 1-2, the x may be the minimum value $x_{min}$, and the y may be the maximum value $y_{max}$. In this case, the relation between the depth of the first layer and x or y is explained with use of FIG. 8.

Figure 8:
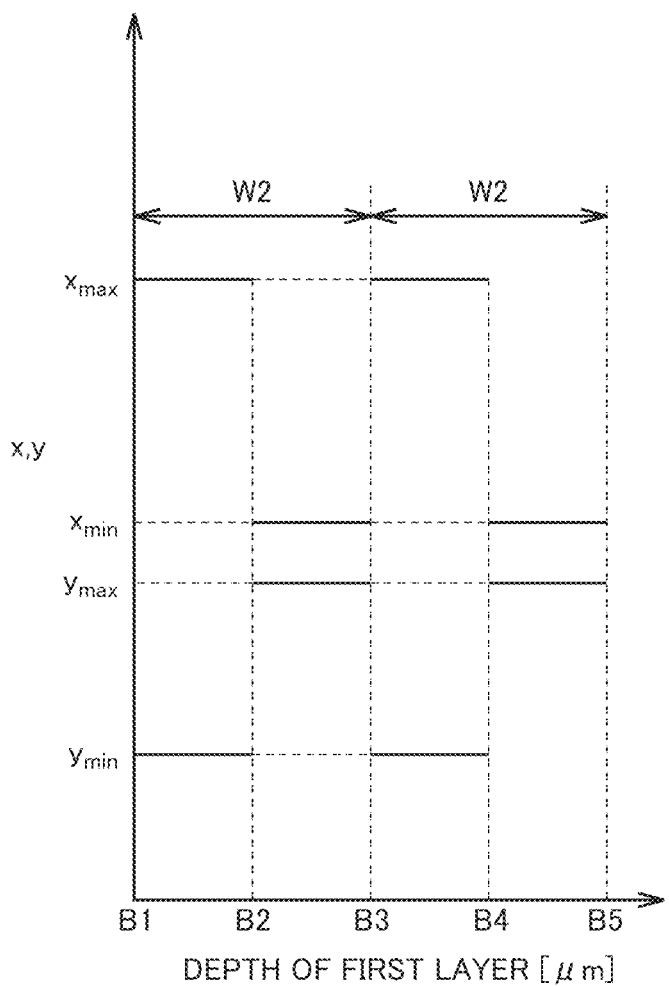
FIG. 8 is a graph showing the relationship between the depth of the first layer and x or y in another aspect of the cutting tool of the present disclosure

In the graph of FIG. 8, the horizontal axis represents the depth of the first layer, and the vertical axis represents the concentration of x or y. The intersection point of the vertical axis and the horizontal axis is a spot nearest to the surface side of the coating film in the first layer. In other words, the intersection point represents a spot, having a depth of 0 μm in the first layer. The spot having a depth of 0 μm in the first layer is represented as B1 in FIG. 8. In the region ranging from a depth of 0 μm (B1) to a depth of B2 μm, the x is the maximum value $x_{max}$ and the y is the minimum value $y_{min}$; and the region corresponds to region No. 1-1. In the region ranging from a depth of B2 μm to a depth of B3 μm, the x is the minimum value $x_{min}$ and the y is the maximum value $y_{max}$; and the region corresponds to region No. 1-2. Further, in the region ranging from a depth of B3 μm to a depth of B4 μm, the x is the maximum value $x_{max}$ and the y is the minimum value $y_{min}$; and the region corresponds to region No. 1-1. In the region ranging from a depth of B4 μm to a depth of B5 μm, the x is the minimum value $x_{min}$ and the y is the maximum value $y_{max}$; and the region corresponds to region No. 1-2

In FIG. 8, the sum total of the depth of a pair next to each other including region No. 1-1 and region No. 1-2, i.e., a distance W2 from a depth of 0 μm (B1) to a depth of B3 μm, or a distance W2 from a depth of B3 μm to a depth of B5 μm, corresponds to the period width.

(Crystallite Size)

In the first layer, the average of the crystallite size is preferably 5 nm or more and 90 nm or less. Thereby, the film strength of the coating film including the first layer is further improved resulting from refinement of the crystallite size. Further, reduction in toughness of the first layer caused by a too small crystallite size is suppressed, so that occurrence of cracks in the first layer may be suppressed. Further, the lower limit of the average of the crystallite size is preferably 8 nm or more, more preferably 12 nm or more, and still more preferably 15 nm or more. The upper limit of the average of the crystallite size is 80 nm or less, more preferably 70 nm or less, and still more preferably 60 nm or less. The average of the crystallite size is preferably 8 nm or more and 80 nm or less, more preferably 12 nm or more and 70 nm or less, and still more preferably 15 nm or more and 60 nm or less.

The average of the crystallite size may be determined by X-ray diffraction measurement (XRD measurement), for example, under the following conditions. Specifically, X-ray is irradiated to the surface of the coating film for the X-ray diffraction measurement (XRD measurement) to measure the full width half maximum (FWHM). The full width half maximum β is assigned to Scherrer's equation represented by the following (1) to derive crystallite size γ.

$$\gamma = K\lambda/\beta \cos\theta \quad (1)$$

wherein K means a shape factor. In the present specification, K is "0.9." Further, λ means the wavelength of X-ray. Here, β means the full width half maximum (FWHM) represented in radian unit. Further, θ means the Bragg angle of the (200) peak of the first layer. The measurement is performed at five spots optionally selected. Subsequently, the average of the crystallite size at the five measurement spots is calculated to determine the average of the crystallite size. Further, in the case where the coating film includes a surface layer (another layer), the XRD measurement is performed after exposure of the first layer.

(Conditions for X-Ray Diffraction Measurement)
  Scanning axis: 2θ-θ
  X-ray source: Cu-Kα line (1.541862 angstrom)
  Detector: zero-dimensional detector (scintillation counter)
  Tube voltage: 45 kV
  Tube current: 40 mA
  Incidence optics: use of mirror
  Photo detective optics: use of analyzer crystal (PW3098/27)
  Step: 0.03°
  Cumulative time: 2 seconds
  Scanning range (2θ): 10° to 120°

It has been confirmed that the same measurement results are obtained at different measurement spots optionally selected in the same cutting tool.

(Residual Stress in First Layer)

The residual stress in the first layer is preferably −3.0 GPa or more and −0.1 GPa or less. Thereby, the film strength of a cutting tool may be further improved. Further, the lower limit of the residual stress in the first layer is preferably −2.8 GPa or more, more preferably −2.5 GPa or more, and still more preferably −2.2 GPa or more. Further, the upper limit of the residual stress in the first layer is preferably −0.2 GPa or less, more preferably −0.3 GPa or less, and still more preferably −0.4 GPa or less. The residual stress in the first layer is preferably −2.8 GPa or more and −0.2 GPa or less, more preferably −2.5 GPa or more and −0.3 GPa or less, and still more preferably −2.5 GPa or more and −0.4 GPa or less. In the case where the residual stress has a negative value, the residual stress means "compressive residual stress".

<Method for Measuring Residual Stress in First Layer>

The residual stress may be determined by a 2θ−sin 2ψ method (side inclination method) with use of X-ray. Specifically, the measurement conditions are as follows. For example, the first layer is analyzed at three optional points on the flank face of the first layer by the 2θ−sin 2ψ method (side inclination method) with use of X-ray, and the average of the residual stresses obtained at these three points is determined as the residual stress in the first layer. Further, in the case where the coating film includes a surface layer (another layer), the XRD measurement is performed after exposure of the first layer.

It has been confirmed that the same measurement results are obtained at different measurement spots optionally selected in the same cutting tool.

(Measurement Conditions)
  Tube voltage: 45 kV
  Tube current: 200 mA
  X-ray source: Cu-Kα line (1.541862 angstrom)
  Incidence optics: collimator having a diameter of 40.3
  Peak for use: TiN (2,0,0)

(Ratio of X-ray diffraction intensity of (200) plane of first layer to sum of X-ray diffraction intensity of (200) plane of first layer, X-ray diffraction intensity of (111) plane of first layer, and X-ray diffraction intensity of (220) plane of first layer)

A ratio of X-ray diffraction intensity $I_{(200)}$ of (200) plane of the first layer to the sum of $I_{(200)}$, X-ray diffraction intensity $I_{(111)}$ of (111) plane of the first layer, and X-ray diffraction intensity $I_{(220)}$ of (220) plane of the first layer, $I_{(200)}/(I_{(200)}+I_{(111)}+I_{(220)})$, is preferably 0.50 or more. Thereby, the toughness of the coating film is enhanced to suppress the propagation of cracks, so that the peeling resistance of the coating film is further improved. Here, "X-ray diffraction intensity $I_{(200)}$ of (200) plane" means the diffraction intensity (height of peak) of the highest peak among X-ray diffraction peaks derived from (200) plane (hereinafter, also referred to as "maximum diffraction intensity"). In the case where two or more compounds contained in the coating film have X-ray diffraction peaks derived from respective (200) planes, or in the case where a plurality of X-ray diffraction peaks derived from (200) planes are present at different positions, "X-ray diffraction intensity $I_{(200)}$ of (200) plane" means the sum of the maximum diffraction intensity (height of peak). The same applies to "X-ray diffraction intensity $I_{(111)}$ of (111) plane", and "X-ray diffraction intensity $I_{(220)}$ of (220) plane".

The lower limit of $I_{(200)}/(I_{(200)}+I_{(111)}+I_{(220)})$ is preferably 0.53 or more, more preferably 0.56 or more, and still more preferably 0.60 or more. The upper limit of $I_{(200)}/(I_{(200)}+I_{(111)}+I_{(220)})$ is preferably 0.97 or less, more preferably 0.94 or less, and still more preferably 0.90 or less. $I_{(200)}/(I_{(200)}+I_{(111)}+I_{(220)})$ is preferably 0.53 or more and 0.97 or less, more preferably 0.56 or more and 0.94 or less, and still more preferably 0.60 or more and 0.90 or less.

$I_{(200)}$, $I_{(111)}$ and $I_{(220)}$ may be determined by X-ray diffraction measurement (XRD measurement), for example, under the following conditions. Specifically, $I_{(200)}$, $I_{(111)}$ and $I_{(220)}$ may be obtained by irradiating X-ray to the surface of the coating film to perform X-ray diffraction measurement (XRD measurement). The measurement is performed at five optionally selected spots on the flank face. Subsequently, the respective averages of $I_{(200)}$, $I_{(111)}$ and $I_{(220)}$ at five spots are calculated. Subsequently, based on the average of $I_{(200)}$, the average of $I_{(111)}$ and the average of $I_{(220)}$, $I_{(200)}/(I_{(200)}+I_{(111)}+I_{(220)})$ may be calculated.

(Conditions for X-Ray Diffraction Measurement)

Scanning axis: 2θ-θ
X-ray source: Cu-Kα line (1.541862 angstrom)
Detector: zero-dimensional detector (scintillation counter)
Tube voltage: 45 kV
Tube current: 40 mA
Incidence optics: use of mirror
Photo detective optics: use of analyzer crystal (PW3098/27)
Step: 0.03°
Cumulative time: 2 seconds
Scanning range (2θ): 10° to 120°

It has been confirmed that the same measurement results are obtained at different measurement spots optionally selected in the same cutting tool.

<Foundation Layer>

The coating film further comprises a foundation layer, and the foundation layer preferably is composed of $Ti_aAl_{1-a}N$ or $Al_pCr_{1-p}N$. In this case, it is preferable that the foundation layer be disposed directly on the substrate and directly under the first layer. Thereby, the adhesion between the substrate and the coating film may be improved.

The foundation layer has a thickness of preferably 0.05 μm or more and 1.0 μm or less. Thereby, the adhesion between the substrate and the coating film may be further improved. The reason is as follows. With a foundation layer having a too thin thickness, the adhesion between the substrate and the coating film tends to be hardly improved, and with a foundation, layer having a too thick thickness, the improvement in the film strength resulting from the refinement of particles in the first layer tends to be hindered. The lower limit of the thickness of the foundation layer is preferably 0.10 μm or more, more preferably 0.15 μm or more, and still more preferably 0.20 μm or more. The upper limit of the thickness of the foundation layer is preferably 0.80 μm or less, more preferably 0.60 μm or less, and still more preferably 0.40 μm or less. The thickness of the foundation layer is preferably 0.10 μm or more and 0.80 μm or less, more preferably 0.15 μm or more and 0.60 μm or less, and still more preferably 0.20 μM or more and 0.40 μm or less.

It is preferable that the a be 0.2 or more and 1.0 or less. Thereby, the adhesion to the substrate is improved, so that the peeling resistance of the coating film may be improved. The a is preferably 0.3 or more and 0.9 or less, more preferably 0.4 or more and 0.8 or less, and still more preferably 0.5 or more and 0.7 or less.

It is preferable that the p be preferably 0 or more and 0.8 or less. Thereby, the adhesion to the substrate is improved, so that the peeling resistance of the coating film may be improved. The p is preferably 0, 1 or more and 0.77 or less, more preferably 0.2 or more and 0.74 or less, and still more preferably 0.3 or more and 0.7 or less.

The a and the p may be determined by the following method. First, a cutting tool is cut at an optional position to prepare a sample including a cross section of the coating film. For the preparation of the sample, a focused ion beam system, a cross section polisher, or the like may be used. Subsequently, the elemental analysis of the sample may be performed by energy dispersive X-ray spectroscopy (EDX) attached to SEM for the determination.

<Other Layer>

Figure 4:
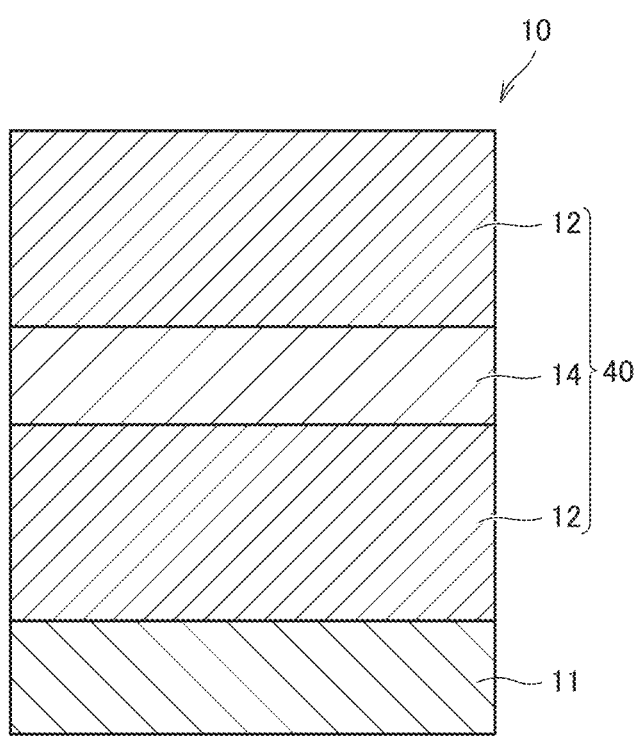
FIG. 4 is a schematic cross-sectional view further showing another aspect of a cutting tool of the present disclosure.
Figure 5:
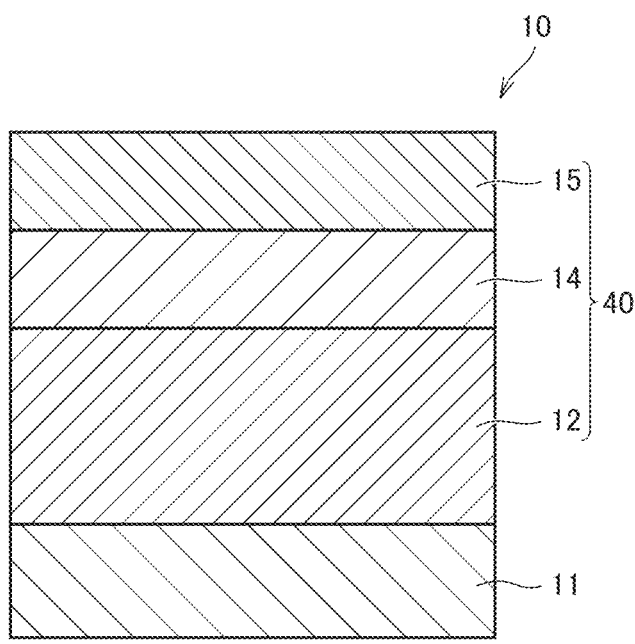
FIG. 5 is a schematic cross-sectional view showing another different aspect of a cutting tool of the present disclosure.
Figure 6:
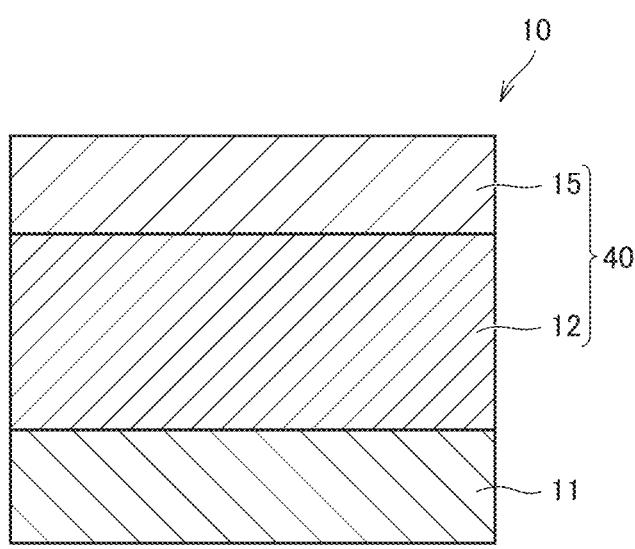
FIG. 6 is a schematic cross-sectional view further showing another different aspect of a cutting tool of the present disclosure.

As long as the effect of the present embodiment is not impaired, the coating film may further include other layers. As shown in FIG. 4 to FIG. 6, examples of the other layers include an intermediate layer 14 and a surface layer 15.

(Intermediate Layer)

The coating film of the present embodiment may include intermediate layer 14, for example, between first layers 12 adjacent to each other (FIG. 4), or between first layer 12 and surface layer 15 (FIG. 5). Intermediate layer 14 is a layer disposed between first layer 12 and another first layer 12 or a layer other than first layer 12 (surface layer 15 or the like). The composition of the intermediate layer may be, for example, titanium nitride (TiN), titanium carbonitride (TiCN), titanium aluminum nitride (TiAlN), titanium aluminum silicon nitride (TiAlSiN), titanium aluminum boron nitride (TiAlBN), titanium aluminum zirconium nitride (TiAlZrN), titanium aluminum hafnium nitride (TiAlHfN), titanium aluminum vanadium nitride (TiAlVN), titanium aluminum niobium nitride (TiAlNbN), titanium aluminum tantalum nitride (TiAlTaN), titanium aluminum chromium nitride (TiAlCrN), titanium aluminum molybdenum nitride (TiAlMoN), or titanium aluminum tungsten nitride (TiAlWN). The thickness of the intermediate layer may be, for example, 0.2 μm or more and 1 μm or less.

(Surface Layer)

The coating film of the present, embodiment may include a surface layer (FIG. 6). Surface layer 15 is a layer disposed nearest to the surface side in coating film 40. However, the surface layer may not be formed at the cutting edge ridgeline, Examples of surface layer 15 include TiN layer. Since the TiN layer has a distinct color (exhibiting golden color), when used as surface layer 15, identification of the corner of a cutting insert after use for cutting (identification of used portion) is advantageously easy.

The thickness of surface layer 15 may be, for example, 0.01 μm or more and 0.3 μm or less.

Embodiment 2: Method for Producing Cutting Tool

A method for producing the cutting tool of embodiment 1 is described as follows. The following production method is an example, and the cutting tool in embodiment 1 may be produced by another method.

A method for producing the cutting tool of the present embodiment includes:
- a first step of preparing the substrate (hereinafter, also referred to simply as "first step"), and
- a third step of forming the coating film on the substrate (hereinafter, also referred to simply as "third step"). Further, the production method further includes a second step of ion bombarding the surface of the substrate obtained in the first step (hereinafter, also referred to simply as "second step"), and a fourth step of dry blasting the surface of the coating film obtained in the third step (hereinafter, also referred to simply as "fourth step"). Each of the steps are described as follows.

<<First Step: Preparing Substrate>>

In the first step, the substrate is prepared. As the substrate, any substrate may be used as long as it is conventionally known as the substrate of this type. For example, a base having a shape according to ISO standard DNGA150408, made of cemented carbide material (equivalent to K10) is prepared. Each of the cutting edge (corner) portions of the base is bonded to a substrate made of polycrystalline cubic boron nitride sintered material (shape: triangular prism having an isosceles triangle bottom with an apex angle of 55°, each of the sides of the angle having a length of 2 mm, and a thickness of 2 mm) so as to obtain a bonded body. For the bonding, a brazing material made of Ti—Zr—Cu is used. Subsequently, the outer peripheral surface, top face and bottom face of the bonded body are ground to form a negative land shape (negative land width: 150 μm, negative land angle: 25°) at the cutting edge. Thus, a base having cutting edge (cuffing blade) portions made of polycrystalline cubic boron nitride sintered materials, respectively, is obtained.

As described above, it is preferable to use a fine-grained grinding stone having a grit size of 700 or more for grinding the outer peripheral surface, the top face and the negative land portion of the bonded body. In the case of using a grinding stone having a grit size of less than 700, irregularities caused from grinding streaks tend to occur, so that the absolute value of $Rsk_{sub}$ tends to increase. Conventionally, it has been presumed that an $Rsk_{sub}$ having a certain value or more is preferred to improve adhesion between the substrate and the coating film. As a result of extensive study, the present inventors have newly found that with an $Rsk_{sub}$ in the range of −2 or more and 2 or less, the surface of the substrate in contact with the coating film has a reduced skew of distribution of the ridges and valleys, so that adhesion between the substrate and the coating film may be improved, and further, the stress concentration caused by a load during processing is reduced, so that the peeling resistance of the coating film may be improved. Further, it has been newly found by the present inventors that with use of a fine-grained grinding stone having a grit size of 700 or more, $Rsk_{sub}$ may be controlled to the range of −2 or more and 2 or less.

<<Second Step: Ion Bombarding Surface of Substrate>>

In the second step, the surface of the substrate is ion bombarded. For example, first, a base is set in a vacuum chamber of a film forming apparatus. Subsequently, the chamber is evacuated. Subsequently, the base is heated to 500° C., while rotating a rotary table at 3 rpm. Subsequently, Ar gas is introduced into the vacuum chamber, and a tungsten filament is discharged to generate Ar ions. A bias voltage is applied to the base, and the base is ion bombarded with Ar ions under the following conditions.

(Conditions for Ion Bombardment)
Pressure of Ar gas: 1 Pa
Basal plate bias voltage: −600 V to −1000 V
Processing time: 10 minutes to 45 minutes Thereby, the $Rsk_{sub}$ may be controlled to the range of −2 or more and 2 or less.

It has been newly found by the present inventors that the ion bombardment of the surface of the substrate under the conditions, $Rsk_{sub}$ may be controlled to the desired value.

<<Third Step: Forming Coating Film on Substrate>>

In the third step, a coating film is formed on the substrate. The third step includes "covering with first layer" for covering at least a part of the surface of the ion bombarded substrate.

Examples of the method for covering at least a part of the surface of the substrate with the first layer include a physical vapor deposition (PVD) method.

Examples of the PVD method include an AIP method (ion plating method for vaporizing solid material with use of vacuum arc discharge) and a sputtering method. In the case of producing a TiAlSiN layer by AIP method, a TiAlSi target as metal evaporation source and $N_2$ as reaction gas may be used. In the case of producing a TiAlSiN layer by sputtering method, a TiAlSi target as metal evaporation source, $N_2$ as reaction gas, and a sputtering gas such as Ar, Kr and Xe as reaction gas may be used. The basal plate (substrate) temperature may be set to 300° C. to 800° C., and the gas pressure may be set to 0.1 to 10 Pa.

Covering with the first layer includes one or both of a step (i) of fluctuating the bias voltage during film forming and a step (ii) of performing simultaneous vapor deposition with two types of target compositions prepared. Through extensive study by the present inventors, it has been newly found that thereby the x and the y in the first layer may be changed along the thickness direction of the first layer.

The step (i) may be performed, for example, by using a TiAlSi target as the target, and intermittently fluctuating the bias voltage between 35 V and 50 V.

The step (ii) may be performed, for example, by using a TiAlSi target and a TiAlN target as two types of targets, and fixing the bias voltage at 30 V.

The third step may include forming other layers such as a foundation layer and a surface layer in addition to covering with the first layer. The other layers may be formed by a conventional method. Hereinafter, "forming a foundation layer" is referred to step (iii) in some cases.

<<Fourth Step: Dry Blasting Surface of Coating Film>>

In a fourth step, the surface of the coating film obtained in the third step is dry blasted. For example, the fourth step is performed as follows. The rake face, flank face and negative land face of the coating film obtained in the third step are blasted with an elastic polishing medium including diamond abrasive grains from a projection distance of 100 ram at a projection angle adjusted to about 15 degrees to 70 degrees for 60 seconds to 120 seconds. Thereby, the roughness of a surface of the coating film, $Ra_{surf}$, may be controlled to 0 μm or more and 0.1 μm or less, and the skewness of a surface of the coating film, $Rsk_{surf}$ may be controlled to −2 or more and 2 or less. It is to be noted that, in the case where the projection angle relative to the face to be blasted is more than 70 degrees, removal of the coating film proceeds more easily than reduction of the surface irregularities and face roughness of the coating film, so that the effect of the coating film tends to be hardly achieved.

Further, in the case where the projection angle is less than 15 degrees, the grinding effect of the elastic polishing medium is hardly achieved, so that the roughness of a surface of the coating film tends to be hardly reduced.

It has been newly found by the present inventors that by dry blasting of the surface of the coating film, $Ra_{surf}$ may be controlled to 0 µm or more and 0.1 µm or less, and $Rsk_{surf}$ may be controlled to −2 or more and 2 or less.

<<Other Steps>>

In the production method of the present embodiment, for example, processing the surface of the coating film other than the steps described above may be appropriately performed by a method other than the fourth step.

EXAMPLES

The present invention is described in more details with reference to Examples, though the present invention is not limited thereto.

<<Preparation of Cutting Tool>>

[Samples No. 1 to No. 48, and samples No. 101 to No. 104]

By the following production method, cutting tools of samples No. 1 to No. 48, and samples No. 101 to No. 104 were prepared.

<First Step: Preparing Substrate>

First a base having a shape according to ISO standard DNGA150408, made of cemented carbide material (equivalent to K10) was prepared Subsequently, the cutting edge (corner) portions of the base were bonded to a substrate made of polycrystalline cubic boron nitride sintered material (shape: triangular prism having an isosceles triangle bottom with an apex angle of 55°, each of the sides of the angle having a length of 2 mm, and a thickness of 2 mm) having a cBN content of 70%, with a binder composition including TiN, $TiB_2$, $Al_2O_3$ and AlN so as to obtain a bonded body. For the bonding, a brazing material made of Ti—Zr—Cu was used. Subsequently, the outer peripheral surface, top face and bottom face of the bonded body were ground to form a negative land shape (negative land width: 150 µm, negative land angle: 25°) at the cutting edge. Grinding was performed using a grinding stone having a grit size shown in the column "grinding stone" of "first step" in Table 1 and Table 2. Thus, a base having cutting edge (cutting blade) portions made of polycrystalline cubic boron nitride sintered materials, respectively, was obtained.

TABLE 1

| Sample No. | First step Grinding stone | Second step Bias Voltage [V] | Second step Time [min] | Third step Covering with first layer Step (i) Bias voltage [V] | Third step Covering with first layer Step (i) Target | Third step Covering with first layer Step (ii) Bias voltage [V] | Third step Covering with first layer Step (ii) Target | | Third step Forming foundation layer Step (iii) Bias Voltage [V] | Third step Forming foundation layer Step (iii) Target | Fourth step Presence/Absence |
|---|---|---|---|---|---|---|---|---|---|---|---|
| 1 | #700 | −1000 | 45 | 30/150 | TiAlSi | — | — | — | — | — | present |
| 2 | #700 | −1000 | 45 | 30/150 | TiAlB | — | — | — | — | — | present |
| 3 | #700 | −1000 | 45 | 30/150 | TiAlZr | — | — | — | — | — | present |
| 4 | #700 | −1000 | 45 | 30/150 | TiAlHf | — | — | — | — | — | present |
| 5 | #700 | −1000 | 45 | 30/150 | TiAlV | — | — | — | — | — | present |
| 6 | #700 | −1000 | 45 | 30/150 | TiAlNb | — | — | — | — | — | present |
| 7 | #700 | −1000 | 45 | 30/150 | TiAlTa | — | — | — | — | — | present |
| 8 | #700 | −1000 | 45 | 307150 | TiAlCr | — | — | — | — | — | present |
| 9 | #700 | −1000 | 45 | 30/150 | TiAlMo | — | — | — | — | — | present |
| 10 | #700 | −1000 | 45 | 30/150 | TiAlW | — | — | — | — | — | present |
| 11 | #700 | −1000 | 45 | — | — | 30 | TiAlSi | TiAl | — | — | present |
| 12 | #700 | −1000 | 45 | — | — | 30 | TiAlB | TiAl | — | — | present |
| 13 | #700 | −1000 | 45 | — | — | 30 | TiAlCr | TiAl | — | — | present |
| 14 | #700 | −1000 | 45 | — | — | 30 | TiAlNb | TiAl | — | — | present |
| 15 | #700 | −1000 | 45 | — | — | 30 | TiAiZr | TiAl | — | — | present |
| 16 | #700 | −1000 | 45 | — | — | 30 | TiAlB | TiAl | — | — | present |
| 17 | #700 | −1000 | 45 | — | — | 30 | TiAlB | Ti | — | — | present |
| 18 | #700 | −1000 | 45 | — | — | 30 | TiAlB | TiAl | — | — | present |
| 19 | #700 | −1000 | 45 | — | — | 30 | TiAlB | TiAl | — | — | present |
| 20 | #700 | −1000 | 45 | — | — | 30 | TiAlB | Ti | — | — | present |
| 21 | #700 | −1000 | 45 | — | — | 30 | TiAlB | TiAl | — | — | present |
| 22 | #700 | −1000 | 45 | — | — | 30 | TiAlB | Ti | — | — | present |
| 23 | #700 | −1000 | 45 | — | — | 30 | TiAlB | TiAlB | — | — | present |
| 24 | #700 | −1000 | 45 | — | — | 30 | TiAlSi | TiAl | — | — | present |
| 25 | #700 | −1000 | 45 | — | — | 30 | TiAlSi | Ti | — | — | present |
| 26 | #700 | −1000 | 45 | — | — | 30 | TiAlSi | TiAl | — | — | present |
| 27 | #700 | −1000 | 45 | — | — | 30 | TiAlSi | TiAl | — | — | present |
| 28 | #700 | −1000 | 45 | — | — | 30 | TiAlSi | Ti | — | — | present |
| 29 | #700 | −1000 | 45 | — | — | 30 | TiAlSi | TiAl | — | — | present |
| 30 | #700 | −1000 | 45 | — | — | 30 | TiAlSi | Ti | — | — | present |

TABLE 2

| | | Second step | Third Step | | | | | | | Fourth |
|---|---|---|---|---|---|---|---|---|---|---|
| | | | Covering with first layer | | | | Forming Foundation layer | | | |
| | | | Step (i) | | Step (ii) | | Step (iii) | | | |
| Sample No. | First step Grinding stone | Bias voltage [V] | Time [min] | Bias voltage [V] | Target | Bias voltage [V] | Target | Kiss voltage [V] | Target | step Presence/Absence |
| 31 | #700 | −1000 | 45 | — | — | 30 | TiAlSi | TiAlSi | — | — | present |
| 32 | #700 | −1000 | 45 | — | — | 30 | TiAlB | TiAl | — | — | present |
| 33 | #700 | −1000 | 45 | — | — | 30 | TiAlB | TiAl | — | — | present |
| 34 | #700 | −1000 | 45 | — | — | 30 | TiAlSi | TiAl | — | — | present |
| 35 | #700 | −1000 | 45 | — | — | 30 | TiAlSi | TiAl | — | — | present |
| 36 | #700 | −1000 | 45 | — | — | 50 | TiAlSi | TiAl | — | — | present |
| 37 | #700 | −1000 | 45 | — | — | 50 | TiAlB | TiAl | — | — | present |
| 38 | #700 | −1000 | 10 | — | — | 50 | TiAlB | TiAl | — | — | present |
| 39 | #700 | −1000 | 45 | — | — | 50 | TiAlB | TiAl | — | — | absent |
| 40 | #700 | −1000 | 45 | — | — | 30 | TiAlB | TiAl | 30 | TiAlN | present |
| 41 | #700 | −1000 | 45 | — | — | 30 | TiAlB | TiAl | 30 | TiAlN | present |
| 42 | #700 | −1000 | 45 | — | — | 30 | TiAlB | TiAl | 30 | TiAlN | present |
| 43 | #700 | −1000 | 43 | — | — | 30 | TiAlB | TiAl | 30 | TiAlN | present |
| 44 | #700 | −1000 | 45 | — | — | 30 | TiAlB | TiAl | 30 | AlCrN | present |
| 45 | #700 | −1000 | 45 | — | — | 30 | TiAlB | TiAl | 30 | AlCrN | present |
| 46 | #700 | −1000 | 45 | — | — | 20 | TiAlSi | TiAl | — | — | present |
| 47 | #700 | −1000 | 45 | — | — | 30 | TiAlSi | TiAl | — | — | present |
| 48 | #700 | −1000 | 45 | — | — | 200 | TiAlSi | TiAl | — | — | present |
| 101 | #700 | −1000 | 45 | — | — | 30 | TiAlB | TiAl | — | — | present |
| 102 | #700 | −1000 | 45 | — | — | 30 | TiAlB | TiAlB | — | — | present |
| 103 | #700 | −1000 | 45 | — | — | 30 | TiAlB | TiAl | — | — | present |
| 104 | #700 | −1000 | 45 | — | — | 30 | TiAlB | TiAl | — | — | present |

<<Second Step: Ion Bombarding Surface of Substrate>>

The base was set in a vacuum chamber of a film forming apparatus. Subsequently, the chamber was evacuated. Subsequently, the base was heated to 500° C., while rotating a rotary table at 3 rpm. Subsequently, Ar gas was introduced into the vacuum chamber (pressure 1 Pa), and a tungsten filament was discharged to generate Ar ions. A bias voltage was applied to the base, and the base was ion bombarded with the Ar ions. The bias voltage and the time for ion bombardment are as shown in columns "Bias voltage" and "Time" of "Second step" in Table 1 and Table 2.

<<Third Step: Forming Coating Film on Substrate>>
<Step (iii): Forming Foundation Layer>

Subsequently, in order to form a foundation layer on the surface of the substrate in sample No. 40 to sample No. 45, by using an arc ion plating method, step (iii) was performed under conditions with use of a target described in column "Target" of "Forming foundation layer" in Table 2, and at a bias voltage described in column "Bias voltage" of "Forming foundation layer" in Table 2.

<Covering with First Layer>

Subsequently, by using an arc ion plating method, a first layer was formed on the surface of the substrate or the foundation layer. The step (i) was performed for samples No. 1 to No. 10, and the step (ii) was performed for samples No. 11 to No. 48, and samples No. 101 to No. 104.

In step (i), by using the target described in column "Target" of "Step (i)" of "Covering with first layer" in Table 1 and Table 2, and $N_2$ gas as reaction gas, covering with first layer was performed at the bias voltage described in column "Bias voltage" The description 30/150 in column "Bias voltage" means that the bias voltage was intermittently switched between 30 V and 150 V. More specifically, a single period in which the bias voltage maintained at 30 V for 120 seconds and then switched to 150 V to be maintained for 120 seconds was repeated. In other words, the single period time was 240 seconds.

In step (ii), by using the two types of targets described in column "Target" of "Step 0p" of "Covering with first layer" in Table 1 and Table 2, and $N_2$ gas as reaction gas, covering with first layer was performed at the bias voltage described in column "Bias voltage". For example, in sample No. 11, TiAlSi and TiAl were used as the targets, $N_2$ gas was used as reaction gas, and the bias voltage was set to 30 V.

In sample No. 31, although both of the two targets are "TiAlSi" targets, the composition ratio of one target (Ti:Al:Si=30:50:20) of the two is different from the composition ratio of another target (Ti:Al:Si=32:49:19) In other words, in sample No. 31, two types of targets were used.

In sample No. 23, although both of the two targets are "TiAlB" targets, the composition ratio of one target (Ti:Al:B=30:50:20) of the two is different from the composition ratio of another target (Ti:Al:B=32:49:19). In other words, in sample No. 23, two types of targets were used.

Further, in sample No. 102, both of the two targets are "TiAlB" targets. Of the two targets, one target has a composition ratio of Ti:Al:B=40:50:10, and another target has a composition ratio of Ti:Al:B=50:40:10.

Further, although using "TiAlB" target and "TiAl" target as two targets is common to sample No. 12, sample No. 101, sample No. 103 and sample No. 104, the composition ratio of the targets is different as follows. In sample No. 12, the composition ratio of "TiAlB" target is Ti:Al:B=50:48:2, and composition ratio of "TiAl" target is Ti:Al=50:50 Further, in sample No. 101, the composition ratio of "TiAlB" target is Ti:Al:B=48:50:2, and composition ratio of "TiAl" target is Ti:Al=50:50. Further, in sample No. 103 and sample No. 104, the composition ratio of "TiAlB" target is Ti:Al:B=50:48:2, and composition ratio of "TiAl" target is Ti:Al=50:50.

<<Fourth Step: Dry Blasting Surface of Coating Film>>

Subsequently, in order to prepare samples No. 1 to No. 38, samples No. 40 to No. 48, and samples No. 101 to No. 104, the surface to be processed (rake face, flank face and negative land face) on the surface of the coating, film obtained in third step was blasted under conditions described in Table 1 and Table 2. The rake face, flank face and negative land face of the coating film were blasted with an elastic polishing medium including diamond abrasive grains from a projection distance of 100 mm at a projection angle adjusted to about 15 degrees to 70 degrees for 60 seconds.

The steps described above were performed to prepare the cutting tools of samples No. 1 to No. 48 and samples No. 101 to No. 104 having constitutions shown in Table 3 and Table 4.

<<Characterization of Cutting Tool>>

Respective properties of cutting tools of samples No. 1 to No. 48 and samples No. 101 to No. 104 were evaluated as follows. Cutting tools of samples No. 1 to No. 48 correspond to Examples, and cutting tools of samples No. 101 to No. 104 correspond to Comparative Examples.

<Measurement of $x_{max}$, $x_{min}$, $y_{max}$, $y_{min}$, a and p, and Identification of M>

With regard to the cutting tools of samples No. 1 to No. 48 and samples No. 101 to No. 104, the type of "M" of $Ti_{(1-x-y)}Al_xM_yN$ in the first layer, "$x_{max}$", "$x_{min}$", "$y_{max}$", and "$y_{min}$", and "a" and "p" of $Ti_aAl_{1-a}N$ or $Al_pCr_{1-p}N$ in the foundation layer were determined by the method described in embodiment 1. Among the results obtained, "M", "$x_{max}$", "$x_{min}$", "$y_{max}$", and "$y_{min}$" are described in "M", item "$x_{max}$", item "$x_{min}$", item "$y_{max}$", and item "$y_{min}$" in Table 3 and Table 4, respectively. Further, among the results obtained, "a" and "p" are described in item "a" and item "p" in Table 3 and Table 4, respectively.

TABLE 3

| Sample No. | M | Thickness of first layer [μm] | $x_{max}$ | $x_{min}$ | $y_{max}$ | $y_{min}$ | $x_{max}$ − $x_{min}$ | $y_{max}$ − $y_{min}$ | Crystallite Size [nm] | Residual stress [GPa] |
|---|---|---|---|---|---|---|---|---|---|---|
| 1 | Si | 3.0 | 0.50 | 0.40 | 0.10 | 0.05 | 0.10 | 0.05 | 31 | −1.3 |
| 2 | B | 3.0 | 0.50 | 0.40 | 0.10 | 0.05 | 0.10 | 0.05 | 34 | −1.3 |
| 3 | Zr | 3.0 | 0.50 | 0.40 | 0.10 | 0.05 | 0.10 | 0.05 | 51 | −1.6 |
| 4 | Hf | 3.0 | 0.50 | 0.40 | 0.10 | 0.05 | 0.10 | 0.05 | 49 | −1.6 |
| 5 | V | 3.0 | 0.50 | 0.40 | 0.10 | 0.05 | 0.10 | 0.05 | 82 | −1.7 |
| 6 | Nb | 3.0 | 0.50 | 0.40 | 0.10 | 0.05 | 0.10 | 0.05 | 73 | −1.5 |
| 7 | Ta | 3.0 | 0.50 | 0.40 | 0.10 | 0.05 | 0.10 | 0.05 | 62 | −1.1 |
| 8 | Cr | 3.0 | 0.50 | 0.40 | 0.10 | 0.05 | 0.10 | 0.05 | 61 | −1.4 |
| 9 | Mo | 3.0 | 0.50 | 0.40 | 0.10 | 0.05 | 0.10 | 0.05 | 44 | −3.0 |
| 10 | W | 3.0 | 0.00 | 0.40 | 0.10 | 0.05 | 0.10 | 0.05 | 42 | −1.2 |
| 11 | Si | 3.0 | 0.50 | 0.48 | 0.02 | 0 | 0.02 | 0.02 | 25 | −1.3 |
| 12 | B | 3.0 | 0.50 | 0.48 | 0.02 | 0 | 0.02 | 0.02 | 25 | −1.8 |
| 13 | Cr | 3.0 | 0.50 | 0.48 | 0.02 | 0 | 0.02 | 0.02 | 90 | −2.0 |
| 14 | Nb | 3.0 | 0.50 | 0.48 | 0.02 | 0 | 0.02 | 0.02 | 84 | −1.4 |
| 15 | Zr | 3.0 | 0.50 | 0.48 | 0.02 | 0 | 0.02 | 0.02 | 87 | −1.2 |
| 16 | B | 3.0 | 0.20 | 0.19 | 0.20 | 0 | 0.01 | 0.20 | 21 | −1.2 |
| 17 | B | 3.0 | 0.70 | 0 | 0.20 | 0 | 0.70 | 0.20 | 30 | −1.3 |
| 18 | B | 3.0 | 0.50 | 0.40 | 0.01 | 0 | 0.10 | 0.01 | 22 | −1.7 |
| 19 | B | 3.0 | 0.50 | 0.40 | 0.20 | 0 | 0.10 | 0.20 | 24 | −1.9 |
| 20 | B | 3.0 | 0.50 | 0 | 0.05 | 0 | 0.50 | 0.05 | 20 | −1.0 |
| 21 | B | 3.0 | 0.61 | 0.60 | 0.05 | 0 | 0.01 | 0.05 | 20 | −1.7 |
| 22 | B | 3.0 | 0.70 | 0 | 0.01 | 0 | 0.70 | 0.01 | 30 | −1.7 |
| 23 | B | 3.0 | 0.50 | 0.49 | 0.20 | 0.19 | 0.01 | 0.01 | 23 | −1.5 |
| 24 | Si | 3.0 | 0.20 | 0.19 | 0.20 | 0 | 0.01 | 0.20 | 24 | −1.7 |
| 25 | Si | 3.0 | 0.70 | 0 | 0.20 | 0 | 0.70 | 0.20 | 25 | −1.7 |
| 26 | Si | 3.0 | 0.50 | 0.40 | 0.01 | 0 | 0.10 | 0.01 | 28 | −1.7 |
| 27 | Si | 3.0 | 0.50 | 0.40 | 0.20 | 0 | 0.10 | 0.20 | 21 | −1.7 |
| 28 | Si | 3.0 | 0.50 | 0 | 0.05 | 0 | 0.50 | 0.05 | 20 | −1.8 |
| 29 | Si | 3.0 | 0.61 | 0.60 | 0.05 | 0 | 0.01 | 0.05 | 28 | −1.9 |
| 30 | Si | 3.0 | 0.70 | 0 | 0.01 | 0 | 0.70 | 0.01 | 29 | −1.6 |

| Sample No. | Foundation Layer Thickness of foundation layer [μm] | a | p | $Rsk_{sub}$ | $Ra_{surf}$ [μm] | $Rsk_{surf}$ | $R_{(200)}$ | Cutting test Maximum amount of wear [μm] |
|---|---|---|---|---|---|---|---|---|
| 1 | — | — | — | −1.6 | 0.07 | −1.3 | 0.55 | 62 |
| 2 | — | — | — | 0.8 | 0.09 | 1.1 | 0.62 | 71 |
| 3 | — | — | — | −0.3 | 0.09 | −0.3 | 0.73 | 82 |
| 4 | — | — | — | −0.1 | 0.09 | 0.1 | 0.67 | 67 |
| 5 | — | — | — | −0.6 | 0.10 | −0.2 | 0.75 | 101 |
| 6 | — | — | — | −1.1 | 0.08 | −0.8 | 0.74 | 87 |
| 7 | — | — | — | −0.2 | 0.09 | 0.6 | 0.74 | 62 |
| 8 | — | — | — | −1.0 | 0.08 | −0.1 | 0.55 | 91 |
| 10 | — | — | — | 0.8 | 0.09 | 1.4 | 0.72 | 77 |
| 10 | — | — | — | −0.7 | 0.08 | −0.1 | 0.85 | 79 |
| 11 | — | — | — | −0.4 | 0.09 | 0.0 | 0.86 | 52 |
| 12 | — | — | — | −0.4 | 0.09 | 0.3 | 0.86 | 82 |
| 13 | — | — | — | 0.3 | 0.07 | 1.0 | 0.55 | 101 |

TABLE 3-continued

| | | | | | | | | |
|---|---|---|---|---|---|---|---|---|
| 14 | — | — | — | 0.8 | 0.09 | 0.9 | 0.56 | 92 |
| 15 | — | — | — | -0.8 | 0.09 | -0.2 | 0.81 | 84 |
| 16 | — | — | — | -1.7 | 0.10 | -0.8 | 0.83 | 72 |
| 17 | — | — | — | 0.0 | 0.07 | 0.8 | 0.75 | 63 |
| 18 | — | — | — | 0.6 | 0.08 | 0.9 | 0.76 | 64 |
| 19 | — | — | — | -1.9 | 0.08 | -1.8 | 0.74 | 94 |
| 20 | — | — | — | -0.5 | 0.08 | -0.4 | 0.83 | 77 |
| 21 | — | — | — | -1.2 | 0.08 | -0.5 | 0.83 | 75 |
| 22 | — | — | — | -0.4 | 0.08 | -0.2 | 0.69 | 62 |
| 23 | — | — | — | 0.6 | 0.10 | 1.3 | 0.84 | 64 |
| 24 | — | — | — | -0.4 | 0.10 | 0.3 | 0.85 | 60 |
| 25 | — | — | — | 0.3 | 0.09 | 0.4 | 0.84 | 62 |
| 26 | — | — | — | -1.4 | 0.10 | -1.1 | 0.85 | 84 |
| 27 | — | — | — | -1.8 | 0.08 | -1.1 | 0.84 | 73 |
| 28 | — | — | — | -0.5 | 0.09 | -0.1 | 0.85 | 80 |
| 29 | — | — | — | 0.8 | 0.10 | 1.1 | 0.84 | 85 |
| 30 | — | — | — | 0.9 | 0.09 | 1.6 | 0.85 | 72 |

TABLE 4

| | | First Layer | | | | | | | |
|---|---|---|---|---|---|---|---|---|---|
| Sample No | M | Thickness of first layer [μm] | $x_{max}$ | $x_{min}$ | $y_{max}$ | $y_{min}$ | $x_{max} - x_{min}$ | $y_{max} - y_{min}$ | Crystallite size [nm] | Residual Stress [GPA] |
| 31 | Si | 3.0 | 0.50 | 0.49 | 0.20 | 0.19 | 0.01 | 0.01 | 22 | -1.0 |
| 32 | B | 0.2 | 0.50 | 0.48 | 0.02 | 0 | 0.02 | 0.02 | 30 | -1.4 |
| 33 | B | 9.0 | 0.50 | 0.48 | 0.02 | 0 | 0.02 | 0.02 | 23 | -1.1 |
| 34 | Si | 0.2 | 0.50 | 0.48 | 0.02 | 0 | 0.02 | 0.02 | 29 | -1.1 |
| 35 | Si | 9.0 | 0.50 | 0.48 | 0.02 | 0 | 0.02 | 0.02 | 29 | -1.8 |
| 36 | Si | 3.0 | 0.50 | 0.48 | 0.02 | 0 | 0.02 | 0.02 | 5 | -3.1 |
| 37 | B | 3.0 | 0.50 | 0.48 | 0.02 | 0 | 0.02 | 0.02 | 5 | -3.1 |
| 33 | B | 3.0 | 0.50 | 0.48 | 0.02 | 0 | 0.02 | 0.02 | 5 | -3.1 |
| 39 | B | 3.0 | 0.50 | 0.48 | 0.02 | 0 | 0.02 | 0.02 | 31 | -3.1 |
| 40 | B | 3.0 | 0.53 | 0.50 | 0.02 | 0 | 0.03 | 0.05 | 31 | -1.3 |
| 41 | B | 3.0 | 0.53 | 0.50 | 0.02 | 0 | 0.03 | 0.05 | 31 | -1.3 |
| 42 | B | 3.0 | 0.53 | 0.50 | 0.02 | 0 | 0.03 | 0.05 | 31 | -1.3 |
| 43 | B | 3.0 | 0.53 | 0.50 | 0.02 | 0 | 0.03 | 0.05 | 31 | -1.3 |
| 44 | B | 3.0 | 0.53 | 0.50 | 0.02 | 0 | 0.03 | 0.05 | 31 | -1.3 |
| 45 | B | 3.0 | 0.53 | 0.50 | 0.02 | 0 | 0.03 | 0.05 | 31 | -1.3 |
| 46 | Si | 3.0 | 0.50 | 0.40 | 0.10 | 0.05 | 0.10 | 0.05 | 31 | -0.1 |
| 47 | Si | 3.0 | 0.50 | 0.40 | 0.10 | 0.05 | 0.10 | 0.05 | 31 | -1.3 |
| 48 | Si | 3.0 | 0.50 | 0.40 | 0.10 | 0.05 | 0.10 | 0.05 | 31 | -1.3 |
| 101 | Si | 3.0 | 0.50 | 0.50 | 0.10 | 0 | 0 | 0.10 | 90 | -1.0 |
| 102 | Si | 3.0 | 0.50 | 0.40 | 0.10 | 0.10 | 0.10 | 0 | 90 | -1.0 |
| 103 | Si | 0.1 | 0.50 | 0.40 | 0.10 | 0 | 0.10 | 0.10 | 51 | -1.0 |
| 104 | Si | 9.1 | 0.50 | 0.40 | 0.10 | 0 | 0.10 | 0.10 | 42 | -1.0 |

| | Foundation layer | | | | | | | Cutting test Maximum amount of wear [μm] |
|---|---|---|---|---|---|---|---|---|
| Sample No | Thickness of foundation layer [μm] | a | p | $Rsk_{sub}$ | $Ra_{surf}$ | $Rsk_{surf}$ | $R_{(200)}$ | |
| 31 | — | — | — | 0.2 | 0.07 | 0.7 | 0.84 | 74 |
| 32 | — | — | — | 0.7 | 0.07 | 1.3 | 0.84 | 105 |
| 33 | — | — | — | -0.1 | 0.10 | 0.6 | 0.85 | 95 |
| 34 | — | — | — | -0.9 | 0.08 | -0.5 | 0.65 | 105 |
| 35 | — | — | — | -0.4 | 0.08 | 0.5 | 0.84 | 94 |
| 36 | — | — | — | -0.5 | 0.08 | 0.1 | 0.86 | 94 |
| 37 | — | — | — | 0.3 | 0.10 | 1.0 | 0.84 | 84 |
| 33 | — | — | — | -2.1 | 0.10 | -1.2 | 0.84 | 101 |
| 39 | — | — | — | -0.5 | 0.11 | 2.1 | 0.84 | 102 |
| 40 | 0.05 | 0.5 | 0.7 | -1.6 | 0.07 | -1.3 | 0.51 | 102 |
| 41 | 1.0 | 0.5 | 0.7 | -1.5 | 0.08 | -1.2 | 0.55 | 103 |
| 42 | 0.3 | 0.2 | 0.7 | -1.3 | 0.06 | -1.4 | 0.56 | 105 |
| 43 | 0.3 | 1.0 | 0.7 | -1.4 | 0.06 | -1.4 | 0.52 | 102 |
| 44 | 0.3 | 0.5 | 0 | -1.3 | 0.08 | -1.3 | 0.52 | 104 |
| 45 | 0.3 | 0.5 | 0.2 | -1.4 | 0.07 | -1.1 | 0.53 | 105 |
| 46 | — | — | — | -1.5 | 0.05 | -1.3 | 0.54 | 104 |
| 47 | — | — | — | -1.6 | 0 | -1.2 | 0.55 | 102 |
| 48 | — | — | — | -1.4 | 0.06 | -1.3 | 0.50 | 104 |
| 101 | — | — | — | 1.9 | 0.09 | 1.9 | 0.71 | 151 |

TABLE 4-continued

| | | | | | | | | |
|---|---|---|---|---|---|---|---|---|
| 102 | — | — | — | 1.8 | 0.09 | 1.8 | 0.74 | 156 |
| 103 | — | — | — | −0.5 | 0.09 | −0.5 | 0.72 | 157 |
| 104 | — | — | — | −1.0 | 0.09 | −0.9 | 0.70 | 153 |

<Measurement of Thickness of First Layer and Thickness of Foundation Layer>

With regard to the cutting tools of samples No. 1 to No. 48 and samples No. 101 to No. 104, the thickness of the first layer was determined by the method described in embodiment 1. The results obtained are described in item "Thickness of first layer [μm]" in Table 3 and Table 4, respectively. Further, with regard to the cutting tools of samples No. 40 to No. 45, the thickness of the foundation layer was determined by the method described in embodiment 1. The results obtained are described in item "Thickness of foundation layer [μm]" in Table 3 and Table 4, respectively.

<Measurement of Average of Crystallite Size in First Layer>

With regard to the cutting tools of samples No. 1 to No. 48 and samples No. 101 to No. 104, the average of the crystallite size in the first layer was determined by the method described in embodiment 1. The results obtained are described in item "Crystallite size [nm]" in Table 3 and Table 4, respectively <Measurement of Residual Stress in First Layer>

With regard to the cutting tools of samples No. 1 to No. 48 and samples No. 101 to No. 104, the residual stress in the first layer was determined by the method described in embodiment 1. The results obtained are described in item "Residual stress [GPa]" in Table 3 and Table 4, respectively, <Measurement of $Rsk_{sub}$, $Ra_{surf}$ and $Rsk_{surf}$>

With regard to the cutting tools of samples No. 1 to No. 48 and samples No. 101 to No. 104, $Rsk_{sub}$ was determined by the method described in embodiment 1. The results obtained are described in item "$Rsk_{sub}$" in Table 3 and Table 4, respectively. Further, with regard to the cutting tools of samples No. 1 to No. 39 and samples No. 101 to No. 104, $Ra_{surf}$ was determined by the method described in embodiment 1. The results obtained are described in item "$Ra_{surf}$ [μm]" in Table 3 and Table 4, respectively. Further, with regard to the cutting tools of samples No. 1 to No. 48 and samples No. 101 to No. 104, $Rsk_{surf}$ was determined by the method described in embodiment 1. The results obtained are described in item "$Rsk_{surf}$" in Table 3 and Table 4, respectively.

<Measurement of $I_{(200)}/(I_{(200)}+I_{(111)}+I_{(220)})$>

With regard to the cutting, tools of samples No. 1 to No. 48 and samples No. 101 to No. 104, $I_{(200)}/(I_{(200)}+I_{(111)}+I_{(220)})$ of the first layer was determined by the method described in embodiment 1. The results obtained are described in item "$R_{(200)}$" in Table 3 and Table 4, respectively.

<<Cutting Test>>

By using the cutting tools of samples No. 1 to No. 48 and samples No. 101 to No. 104 thus prepared, the following cutting test was performed.

With regard to the cutting tools of samples No. 1 to No. 48 and samples No. 101 to No. 104, a cutting test of work material was performed under the following cutting conditions. When the cutting, distance reached 50 m, the cutting tool and the work material in contact with each other were once separated. Subsequently, after the passage of 3 seconds from the separation, cutting of the work material was performed again under the following cutting conditions. Until the cutting distance reached 4 km, the procedure was repeated. Subsequently, when the cutting distance reached 4 km, the maximum amount of wear at the flank face of the cutting tool was measured. In the case where destruction of the coating film occurs, wear tends to easily proceed from the site of occurrence of the destruction as starting point, so that the maximum amount of wear tends to increase. Accordingly, even in high efficiency processing, a cutting tool has a longer tool life with decrease in the maximum amount of wear. The maximum amount of wear is described in item "Maximum amount of wear [μm]" in Table 3 and Table 4.

(Cutting Conditions)

Work material: high hardness steel SCM415 (HRC62) (diameter 100 mm, length: 300 mm)

Cutting rate: V=150 m/min.

Feed: f=0.2 mm/rev.

Notch: ap=0.5 mm

Wet process/dry process: wet process

The cutting conditions correspond to high efficiency processing.

<Results>

Samples No. 1 to No. 48 correspond to Examples. Samples No. 101 to No. 104 correspond to Comparative Examples. From the results in Table 3 and Table 4, it has been found that the cutting tools of samples No. 1 to No. 48 corresponding to Examples have a longer tool life even in high efficiency processing than the cutting tools of samples No. 101 to No. 104 corresponding to Comparative Examples.

Although the embodiment and Examples of the present disclosure have been explained as stated above, an appropriate combination and various modifications of the constitution of each of the embodiments and Examples described above are also expected from the beginning.

The embodiment and Examples disclosed herein are exemplification in all respects and should not be considered to be restrictive. The scope of the present invention is not represented by the embodiment and Examples but by the claims, and intended to include equivalent to the scope of the claims and all the changes within the scope of the claims

REFERENCE SIGNS LIST

1: rake face, 2: flank face, 3: cutting edge ridgeline, 10: cutting tool, 11: substrate, 12: first layer, 13: foundation layer, 14: intermediate layer, 15: surface layer, 40: coating film, w1 and w2: period width, a1 to a5 and b1 to b5: depth of first layer, 11: average line

The invention claimed is:

1. A cutting tool comprising a substrate and a coating film disposed on the substrate, wherein
the coating film comprises a first layer;
the first layer has a thickness of 0.2 μm or more and 9 μm or less;
the first layer is composed of $Ti_{(1-x-y)}Al_xM_yN$,
wherein M is at least one element selected from the group consisting of zirconium, hafnium, a group V element in the periodic table, a group VI element, silicon and boron;

in the first layer, x and y change along a thickness direction of the first layer;

a maximum value of x, $x_{max}$, is 0.20 or more and 0.70 or less;

a minimum value of x, $x_{min}$, is 0 or more and 0.60 or less;

$x_{max}$ and $x_{min}$ satisfy $0.01 \leq x_{max} - x_{min} \leq 0.70$;

a maximum value of y, $y_{max}$, is 0.01 or more and 0.20 or less;

a minimum value of y, $y_{min}$, is 0 or more and 0.19 or less; and $y_{max}$ and $y_{min}$ satisfy $0.01 \leq y_{max} - y_{min} \leq 0.20$;

wherein a roughness of a surface of the coating film, $Ra_{surf}$, is 0 μm or more and 0.1 μm or less, wherein a skewness of a surface of the coating film, $Rsk_{surf}$, is −2 or more and 2 or less, wherein a skewness of a surface of the substrate in contact with the coating film, $Rsk_{sub}$, is −2 or more and 2 or less.

2. The cutting tool according to claim 1, wherein a ratio of X-ray diffraction intensity $I_{(200)}$ of (200) plane of the first layer to a sum of $I_{(200)}$, X-ray diffraction intensity $I_{(111)}$ of (111) plane of the first layer, and X-ray diffraction intensity $I_{(220)}$ of (220) plane of the first layer, $I_{(200)}/(I_{(200)}+I_{(111)}+I_{(220)})$, is 0.50 or more.

3. The cutting tool according to claim 1, wherein the first layer has a residual stress of −3.0 GPa or more and −0.1 GPa or less.

4. The cutting tool according to claim 3, wherein a ratio of X-ray diffraction intensity $I_{(200)}$ of (200) plane of the first layer to a sum of $I_{(200)}$, X-ray diffraction intensity $I_{(111)}$ of (111) plane of the first layer, and X-ray diffraction intensity $I_{(220)}$ of (220) plane of the first layer, $I_{(200)}/(I_{(200)}+I_{(111)}+I_{(220)})$, is 0.50 or more.

5. The cutting tool according to claim 1, wherein in the first layer, an average of crystallite size is 5 nm or more and 90 nm or less.

6. The cutting tool according to claim 5, wherein a ratio of X-ray diffraction intensity $I_{(200)}$ of (200) plane of the first layer to a sum of $I_{(200)}$, X-ray diffraction intensity $I_{(111)}$ of (111) plane of the first layer, and X-ray diffraction intensity $I_{(220)}$ of (220) plane of the first layer, $I_{(200)}/(I_{(200)}+I_{(111)}+I_{(220)})$, is 0.50 or more.

7. The cutting tool according to claim 5, wherein the first layer has a residual stress of −3.0 GPa or more and −0.1 GPa or less.

8. The cutting tool according to claim 7, wherein a ratio of X-ray diffraction intensity $I_{(200)}$ of (200) plane of the first layer to a sum of $I_{(200)}$, X-ray diffraction intensity $I_{(111)}$ of (111) plane of the first layer, and X-ray diffraction intensity $I_{(220)}$ of (220) plane of the first layer, $I_{(200)}/(I_{(200)}+I_{(111)}+I_{(220)})$, is 0.50 or more.

9. The cutting tool according to claim 5, wherein the coating film further comprises a foundation layer;

the foundation layer is disposed directly on the substrate and directly under the first layer;

the foundation layer has a thickness of 0.05 μm or more and 1.0 μm or less;

the foundation layer is composed of $Ti_aAl_{1-a}N$ or $Al_pCr_{1-p}N$;

a is 0.2 or more and 1.0 or less, and p is 0 or more and 0.8 or less.

10. The cutting tool according to claim 9, wherein a ratio of X-ray diffraction intensity $I_{(200)}$ of (200) plane of the first layer to a sum of $I_{(200)}$, X-ray diffraction intensity $I_{(111)}$ of (111) plane of the first layer, and X-ray diffraction intensity $I_{(220)}$ of (220) plane of the first layer, $I_{(200)}/(I_{(200)}+I_{(111)}+I_{(220)})$, is 0.50 or more.

11. The cutting tool according to claim 9, wherein the first layer has a residual stress of −3.0 GPa or more and −0.1 GPa or less.

12. The cutting tool according to claim 11, wherein a ratio of X-ray diffraction intensity $I_{(200)}$ of (200) plane of the first layer to a sum of $I_{(200)}$, X-ray diffraction intensity $I_{(111)}$ of (111) plane of the first layer, and X-ray diffraction intensity $I_{(220)}$ of (220) plane of the first layer, $I_{(200)}/(I_{(200)}+I_{(111)}+I_{(220)})$, is 0.50 or more.

13. The cutting tool according to claim 1, wherein the coating film further comprises a foundation layer;

the foundation layer is disposed directly on the substrate and directly under the first layer;

the foundation layer has a thickness of 0.05 μm or more and 1.0 μm or less;

the foundation layer is composed of $Ti_aAl_{1-a}N$ or $Al_pCr_{1-p}N$;

a is 0.2 or more and 1.0 or less, and p is 0 or more and 0.8 or less.

14. The cutting tool according to claim 13, wherein a ratio of X-ray diffraction intensity $I_{(200)}$ of (200) plane of the first layer to a sum of $I_{(200)}$, X-ray diffraction intensity $I_{(111)}$ of (111) plane of the first layer, and X-ray diffraction intensity $I_{(220)}$ of (220) plane of the first layer, $I_{(200)}/(I_{(200)}+I_{(111)}+I_{(220)})$, is 0.50 or more.

15. The cutting tool according to claim 13, wherein the first layer has a residual stress of −3.0 GPa or more and −0.1 GPa or less.

16. The cutting tool according to claim 15, wherein a ratio of X-ray diffraction intensity $I_{(200)}$ of (200) plane of the first layer to a sum of $I_{(200)}$, X-ray diffraction intensity $I_{(111)}$ of (111) plane of the first layer, and X-ray diffraction intensity $I_{(220)}$ of (220) plane of the first layer, $I_{(200)}/(I_{(200)}+I_{(111)}+I_{(220)})$, is 0.50 or more.

\* \* \* \* \*